(12) United States Patent
Mitsuishi et al.

(10) Patent No.: US 10,825,707 B2
(45) Date of Patent: Nov. 3, 2020

(54) STACKING APPARATUS AND STACKING METHOD

(71) Applicant: NIKON CORPORATION, Tokyo (JP)

(72) Inventors: Hajime Mitsuishi, Yokohama (JP); Isao Sugaya, Kawasaki (JP); Minoru Fukuda, Tokyo (JP)

(73) Assignee: Nikon Corporation, Tokyo (JP)

(*) Notice: Subject to any disclaimer, the term of this patent is extended or adjusted under 35 U.S.C. 154(b) by 138 days.

(21) Appl. No.: 16/220,356

(22) Filed: Dec. 14, 2018

(65) Prior Publication Data

US 2019/0122915 A1 Apr. 25, 2019

Related U.S. Application Data

(63) Continuation of application No. PCT/JP2017/021874, filed on Jun. 13, 2017.

(30) Foreign Application Priority Data

Jun. 16, 2016 (JP) ................................. 2016-120021

(51) Int. Cl.
*H01L 21/68* (2006.01)
*H01L 21/687* (2006.01)
(Continued)

(52) U.S. Cl.
CPC .......... *H01L 21/68* (2013.01); *H01L 21/6732* (2013.01); *H01L 21/67092* (2013.01);
(Continued)

(58) Field of Classification Search
CPC combination set(s) only.
See application file for complete search history.

(56) References Cited

U.S. PATENT DOCUMENTS

| 6,452,259 B2 * | 9/2002 | Akiyama | ............ H01L 25/0652 257/686 |
| 2003/0116776 A1 * | 6/2003 | Oppermann | ......... H05K 1/0219 257/100 |

(Continued)

FOREIGN PATENT DOCUMENTS

| JP | 2013-258377 A1 | 12/2013 |
| JP | 2015-228449 A | 12/2015 |
| WO | WO 2012/147343 A1 | 11/2012 |

OTHER PUBLICATIONS

International Search Report issued by the Japanese Patent Office dated Aug. 15, 2017 in counterpart International Application No. PCT/JP2017/021874, and English translation thereof.

(Continued)

*Primary Examiner* — Kyle O Logan
(74) *Attorney, Agent, or Firm* — Finnegan, Henderson, Farabow, Garrett & Dunner, L.L.P.

(57) ABSTRACT

A stacking apparatus that stacks a first substrate and a second substrate includes: a plurality of holding members that hold the first substrate, wherein the plurality of holding members correct positional misalignment of the first substrate relative to the second substrate by preset amounts of correction, and the plurality of holding members include holding members having the amounts of correction that are different from each other. The stacking apparatus may further include a carrying unit that carries a holding member that is selected from among the plurality of holding members and holds the first substrate from a position where the holding member is housed to a position where the first substrate is held.

26 Claims, 22 Drawing Sheets

(51) Int. Cl.
  *H01L 21/673* (2006.01)
  *H01L 21/67* (2006.01)
  *H01L 21/683* (2006.01)
(52) U.S. Cl.
  CPC .. *H01L 21/67265* (2013.01); *H01L 21/67346* (2013.01); *H01L 21/681* (2013.01); *H01L 21/68735* (2013.01); *H01L 21/68764* (2013.01); *H01L 21/68771* (2013.01); *H01L 21/6831* (2013.01); *H01L 21/6838* (2013.01)

(56) References Cited

U.S. PATENT DOCUMENTS

| 2016/0020136 A1* | 1/2016 | Thallner | H01L 21/68721 |
| | | | 294/65.5 |
| 2017/0219793 A1* | 8/2017 | Olesen | B32B 37/0076 |

OTHER PUBLICATIONS

Written Opinion of the International Searching Authority dated Dec. 18, 2018 by the International Bureau of WIPO in International Application No. PCT/JP2017/021874.

* cited by examiner

STACKING APPARATUS AND STACKING METHOD

BACKGROUND

1. Technical Field

The contents of the following Japanese and International patent applications are incorporated herein by reference:
NO. 2016-120021 filed on Jun. 16, 2016, and
NO. PCT/JP2017/021874 filed on Jun. 13, 2017.

The present invention relates to a stacking apparatus and a stacking method.

2. Related Art

A stacked semiconductor device is manufactured by stacking substrates (please see Patent Literature 1, for example).

[Patent Literature 1] Japanese Patent Application Publication No. 2013-258377

There is a need for improvement in precision of alignment of substrates to be stacked.

A first aspect of the present invention provides a stacking apparatus that stacks a first substrate and a second substrate, the stacking apparatus including: a plurality of holding members that hold the first substrate, wherein the plurality of holding members correct positional misalignment of the first substrate relative to the second substrate by preset amounts of correction, and the plurality of holding members include holding members having the amounts of correction that are different from each other.

A second aspect of the present invention provides a stacking method of stacking a first substrate and a second substrate, the stacking method including: preparing a plurality of holding members that holds the first substrate and corrects positional misalignment of the first substrate relative to the second substrate by preset amounts of correction, the plurality of holding members including holding members to correct the first substrate by amounts of correction that are different from each other, and causing any of the plurality of holding members to hold the first substrate based on information about the first substrate and the second substrate.

The summary clause does not necessarily describe all necessary features of the embodiments of the present invention. The present invention may also be a sub-combination of the features described above.

DESCRIPTION OF EXEMPLARY EMBODIMENTS

Hereinafter, some embodiments of the present invention will be described. The embodiment(s) do(es) not limit the invention according to the claims, and all the combinations of the features described in the embodiment(s) are not necessarily essential to means provided by aspects of the invention.

Figure 1:
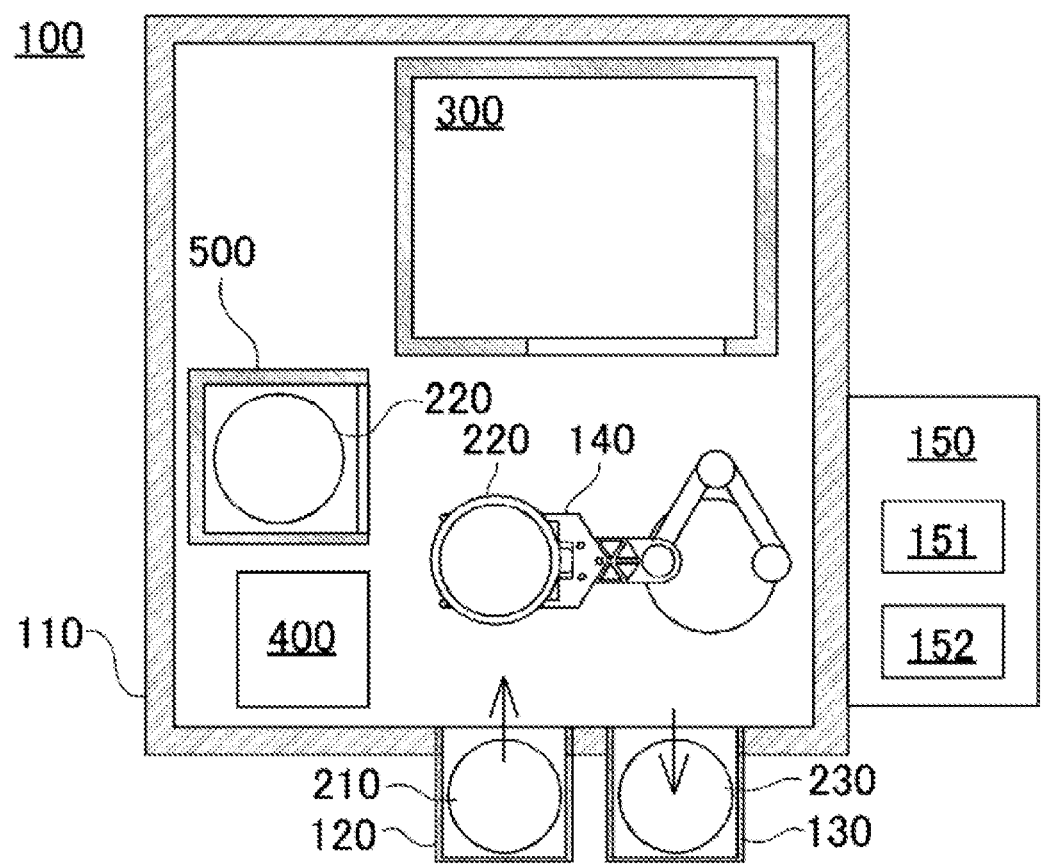
FIG. 1 is a schematic view of a stacking apparatus 100.

FIG. 1 is a schematic plan view of a stacking apparatus 100. The stacking apparatus 100 is an apparatus that stacks one substrate 210 and a different substrate 210 to form a stacked body 230. The stacking apparatus 100 includes: a housing 110; substrate cassettes 120, 130 and a control unit 150 that are disposed outside the housing 110; and a carrying unit 140, a stacking unit 300, a holder stocker 400 and a prealigner 500 that are disposed inside the housing 110.

One of the substrate cassettes, the substrate cassette 120, houses a plurality of substrates 210 to be stacked. The different one of the substrate cassettes, the substrate cassette 130, houses a plurality of stacked bodies 230 formed by stacking substrates 210. A plurality of substrates 210 can be carried into the stacking apparatus 100 collectively by using the substrate cassette 120. In addition, a plurality of stacked bodies 230 can be carried out of the stacking apparatus 100 collectively by using the substrate cassette 130.

The carrying unit 140 carries, inside the stacking apparatus 100, any of a substrate 210, a substrate holder 220, a substrate holder 220 holding a substrate 210 and a stacked body 230 formed by stacking substrates 210. A plurality of substrate holders 220 are housed in the holder stocker 400.

Substrate holders 220 are exemplary holding members, and are highly rigid disk-like members having dimensions larger than substrates 210. Each of the substrate holders 220 has the function of suctionally attracting substrates which is realized by an electrostatic chuck, a vacuum chuck or the like, and individually holds substrates 210 inside the stacking apparatus 100. Thereby, substrate holders 220 are carried together with fragile substrates 210 by the carrying unit 140 while protecting the substrates 210. Holding members to hold substrates 210 are not limited to the substrate holders 220, but stages on which substrates 210 are placed in the stacking unit 300 of the stacking apparatus 100 may also be holding members.

The prealigner 500 detects the center of a substrate 210, positions the center of the substrate 210 to match the center of a substrate holder 220, and causes the substrate holder 220 to hold the substrate 210 in that state. In addition, the prealigner 500 aligns the relative positions and directions of a substrate 210 and a substrate holder 220, and reduces the load of a positional alignment process in the stacking unit 300 mentioned below. Furthermore, the prealigner 500 is used also in separating a stacked body 230 carried out of the stacking unit 300 from a substrate holder 220.

The control unit 150 performs overall control of individual units of the stacking apparatus 100 such that they cooperate with each other. In addition, upon receiving a user instruction from the outside, the control unit 150 sets manufacturing conditions to be applied in manufacturing stacked bodies 230. Furthermore, the control unit 150 also has a user interface that displays the operation state of the stacking apparatus 100 toward the outside.

Still furthermore, the control unit 150 has a holder selecting unit 151 and a substrate selecting unit 152. The holder selecting unit 151 is an exemplary holding member selecting unit, and selects substrate holders 220 satisfying a predetermined condition among a plurality of substrate holders 220 housed in the holder stocker 400. The predetermined condition is that the substrate holders 220 will be able to hold substrates 210 with positional misalignment between the substrates 210 that occurs in a formed stacked body 230 not exceeding a threshold when the substrates 210 are stacked in the stacking apparatus 100.

Here, a plurality of substrate holders 220 housed in the holder stocker 400 each has a holding surface to hold a substrate 210, and the individual holding surfaces have states that are different from each other. The states are at least one of: the magnitudes of the degrees of convexness of the holding surfaces of the plurality of substrate holders 220; the magnitudes of the curvatures of the holding surfaces; the levels of the temperatures of the holding surfaces; the degrees of the surface roughness of the holding surfaces; and the strengths of the holding forces of the holding surfaces.

In this manner, a plurality of substrate holders 220 having holding surfaces in states that are different from each other are prepared, and a substrate holder 220 to be used when a substrate 210 is stacked is selected appropriately; thereby, positional misalignment between substrates 210 in a stacked body 230 can be suppressed or removed as mentioned below.

The substrate selecting unit 152 selects a substrate 210 suited for a substrate holder 220 from a plurality of substrates 210 housed in the substrate cassette 120. For a substrate 210, the holder selecting unit 151 selects, from a plurality of substrate holders 220 housed in the holder stocker 400, a substrate holder 220 to hold the substrate 210. In contrast, for one substrate holder 220, the substrate selecting unit 152 selects a substrate 210 that allows suppression or removal of positional misalignment between the substrate 210 and a different substrate 210 in a stacked body 230 by the former substrate 210 being held by the substrate holder 220. Selection operation of these holder selecting unit 151 and substrate selecting unit 152 is mentioned below.

The stacking unit 300 has a pair of stages that each hold a substrate 210 and face each other, and after the substrates 210 held on the stages are aligned with each other, brings them into contact with each other and stacks them to thereby form a stacked body 230. Substrates 210 are carried into the stacking unit 300 while being kept held by substrate holders 220, and are stacked in the stacking unit 300.

A stacked body 230 formed in the thus-structured stacking apparatus 100 is finally separated from substrate holders 220 carried out of the stacking apparatus 100. Therefore, the substrate holders 220 separated from substrates 210 or the stacked body 230 stay inside the stacking apparatus 100 and used repeatedly. Therefore, the substrate holders 220 can be considered as constituting part of the stacking apparatus 100.

Substrates 210 to be stacked in the stacking apparatus 100 may be substrates 210 on which devices, circuits, terminals or the like are formed or may otherwise be unprocessed silicon wafers, compound semiconductor wafers, glass substrates or the like. In addition, a combination of substrates 210 to be stacked may consist of a circuit substrate and an unprocessed substrate or may consist of unprocessed substrates. Furthermore, substrates 210 to be stacked may themselves be stacked bodies 230 already formed by stacking a plurality of substrates.

Figure 2:
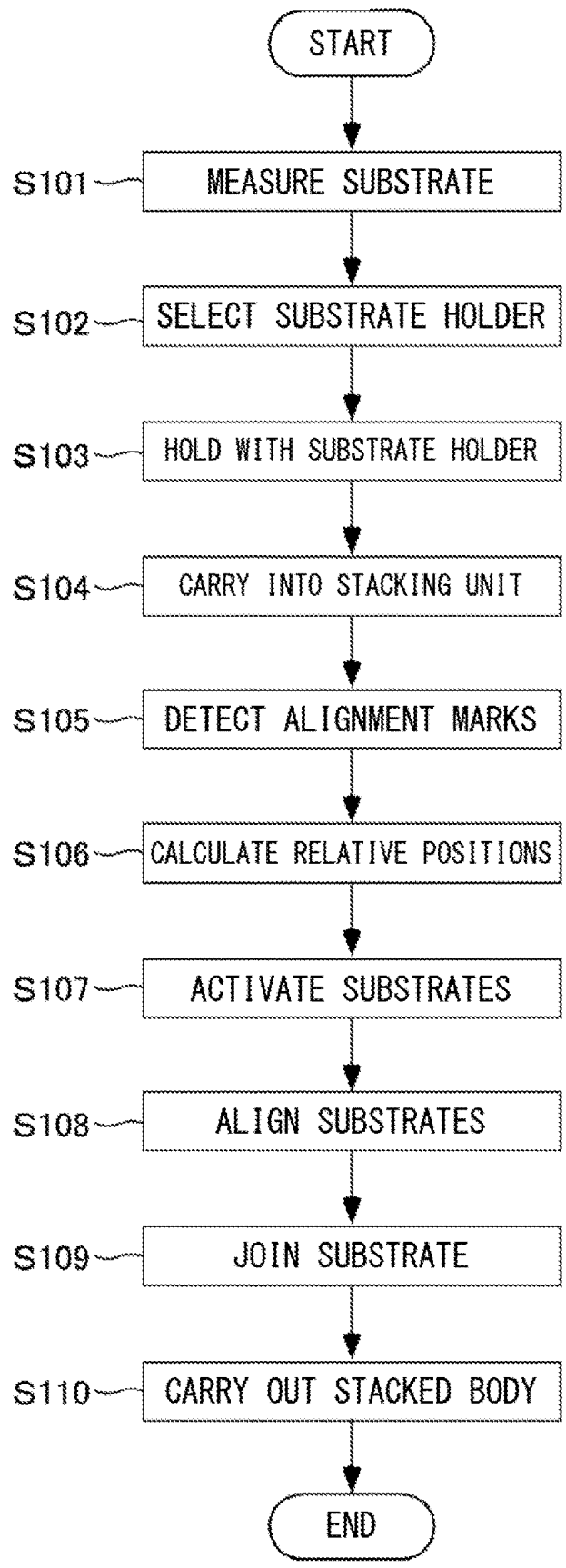
FIG. 2 is a flowchart showing a stacking procedure.

FIG. 2 is a flowchart showing a procedure performed in the stacking apparatus 100 to stack substrates 210 and fabricate a stacked body 230. FIG. 2 is referred to at many points in the following explanations.

The control unit 150 of the stacking apparatus 100 first measures the state of a substrate 210 carried into the stacking apparatus 100 from the substrate cassette 120 using the carrying unit 140 (Step S101). Here, the state of the substrate 210 means the extent of a difference in the shape of the substrate 210 from a predetermined shape. In addition, the extent of the difference for example means the amount of the difference of the substrate 210 from a predetermined imaginary flat shape.

Figure 3:
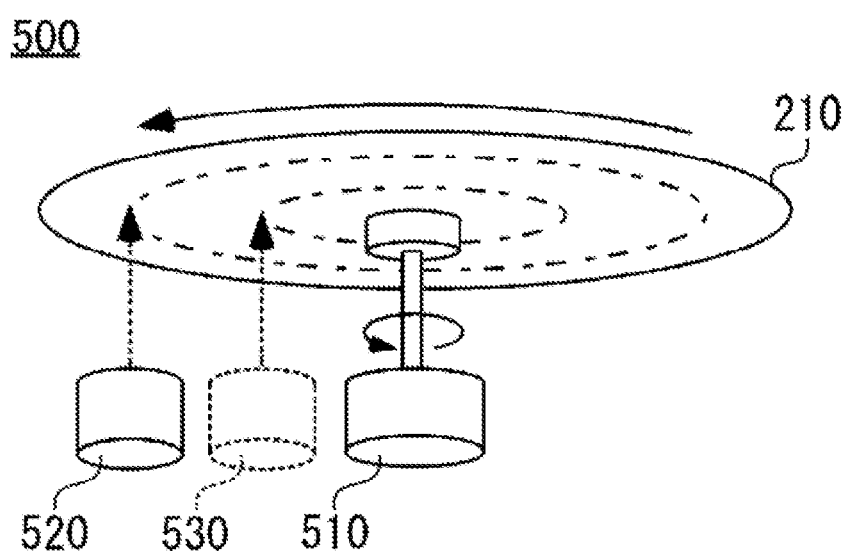
FIG. 3 is a schematic view for explaining measurement of a substrate 210 in a prealigner 500.

FIG. 3 is a schematic view showing an example of measurement of a substrate 210 using part of the prealigner 500. The prealigner 500 has a rotation drive unit 510, an edge detecting unit 520 and a distance measuring unit 530.

The rotation drive unit 510 rotates a substrate 210 mounted thereon while supporting portions near the center of the substrate 210 against gravity. The edge detecting unit 520 continuously detects positions of external circumferential end portions of the rotating substrate 210. Thereby, the prealigner 500 detects an eccentricity of the substrate 210 relative to the rotation center and detects the geometric center of the individual substrate 210. In addition, the prealigner 500 detects a notch or the like provided to the substrate 210 and detects also the orientation of the substrate 210.

When the substrate 210 is to be held by the substrate holder 220, the prealigner 500 aligns the detected central position and orientation of the substrate 210 with the center and orientation of the substrate holder 220 so that they match each other. Thereby, when the substrate 210 is aligned with a different substrate 210, extremely large positional misalignment is prevented, and the load of a highly precise alignment process can be suppressed.

The prealigner 500 further measures deformation of the substrate 210 using the distance measuring unit 530. The distance measuring unit 530 detects a distance to the bottom surface (in the figure) of the rotating substrate 210 in a direction parallel with the axis of rotation. Thereby, it is possible to detect deformation of the substrate 210 in the thickness direction successively in the circumferential direction based on fluctuation in the detected distance. Furthermore, by causing the distance measuring unit 530 to scan the substrate 210 in the radial direction, it is possible to measure the state about deformation of the entire substrate 210. Such a state about deformation of the entire substrate 210 is one type of shape-related information of a substrate 210. The shape-related information of the substrate 210 is one type of information about two substrates 210 to be bonded together.

A substrate 210 detected to be deformed to an extent greater than a predetermined range at this step may be determined as not being suited for stacking. The substrate 210 determined as not being suited for stacking may be carried to a predetermined position, for example, a particular housing position in the substrate cassette 130, and excluded from to-be-stacked objects.

Determination of excluding a substrate 210 from to-be-stacked objects may be made for example based on a fact that an amount of deformation of a substrate 210 exceeds a predetermined range. Here, being exceeding a predetermined range for example means that a substrate 210 is so deformed that a suctional attraction force of a substrate holder 220, which is a holding member, is not sufficient for the substrate 210 to be closely adhered to a holding surface of the substrate holder 220.

In addition, being exceeding a predetermined range for example means that an amount of deformation of a substrate 210 having become a to-be-measured object exceeds the limit of amounts of correction in correction mentioned below. Furthermore, being exceeding a predetermined range means for example that if a combination of a substrate 210 having become a to-be-measured object and a substrate 210 to be stacked onto it is already determined, positional misalignment due to a difference between amounts of deformation of the two substrate 210 has reached a magnitude that cannot be removed in correction mentioned below. An amount of correction is an amount of deformation that is caused to at least either one of two substrates 210 to be joined with each other such that positional misalignment between the two substrates 210 becomes equal to or smaller than a threshold.

One example of the threshold is a misalignment amount that allows at least partial contact between connection portions individually provided to the substrates 210. If a misalignment amount has become equal to or larger than this threshold, the connection portions do not contact each other, appropriate electrical connection cannot be obtained, or a predetermined joining strength cannot be obtained between the joining portions.

About a substrate 210 that is not excluded from to-be-stacked objects at this step, the holder selecting unit 151 of the control unit 150 determines whether or not correction is necessary according to individual measurement results, and if correction is necessary, further calculates an amount of correction. Furthermore, the holder selecting unit 151 selects, from a plurality of substrate holders 220, a substrate holder 220 to hold the substrate 210 such that positional misalignment between the substrate 210 and a different substrate 210 generated to a stacked body 230 formed by the substrates 210 does not exceed the threshold (Step S102).

The prealigner 500 causes the selected substrate holder 220 to hold the substrate 210 (Step S103). If positional misalignment is corrected by deforming one of two substrates 210 to be stacked such that the one substrate 210 matches the different substrate 210, the different substrate 210 does not require deformation for correction of positional misalignment.

Figure 4:
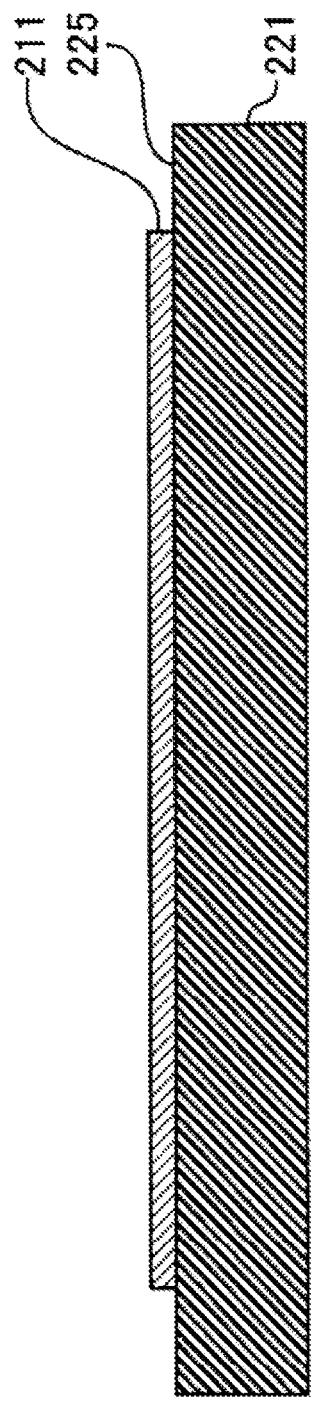
FIG. 4 is a schematic cross sectional view of a substrate holder 221.

FIG. 4 is a schematic cross sectional view of a substrate holder 221 to hold one substrate 211 of two substrates 210 to be stacked in the stacking apparatus 100. The substrate holder 221 has a flat holding surface 225 and the function of suctionally attracting and holding the substrate 211 which is realized by an electrostatic chuck, vacuum chuck or the like.

The one substrate 211 of the two substrates 210 is, as mentioned below, released from holding by the substrate holder 221 at a step of being stacked onto the different substrate 213. In the present example, the one substrate 211 is held by a substrate holder 221 having a flat holding surface 225. Therefore, the holder selecting unit 151 selects the substrate holder 221 having the flat holding surface 225 as illustrated in the figure, as a substrate holder 221 to hold the substrate 211. If a substrate 211 is mentioned in the following explanation, it refers to one that is held by one substrate holder 221 among two substrates 210 to be stacked.

Figure 5:
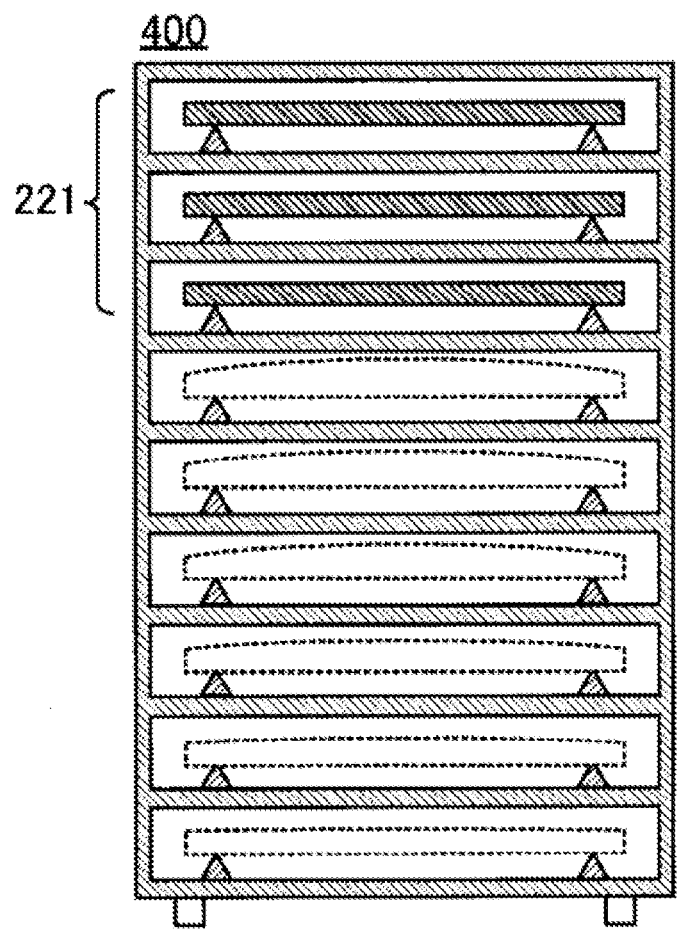
FIG. 5 is a schematic view of a holder stocker 400.

FIG. 5 is a schematic view of the holder stocker 400 housing substrate holders 221. The holder stocker 400 has a plurality of housing units, and can house the plurality of substrate holders 221. In the example illustrated in the figure, three among a large number of housing units each house one substrate holder 221.

The three substrate holders 221 illustrated in the figure have the same specification. The holder selecting unit 151 determines which one among the substrate holders 221 to use such that their wear becomes uniform, and so on. Different substrate holders 223 housed in the holder stocker 400 that are indicated by dotted lines in the figure are explained next with reference to FIG. 6.

Figure 6:
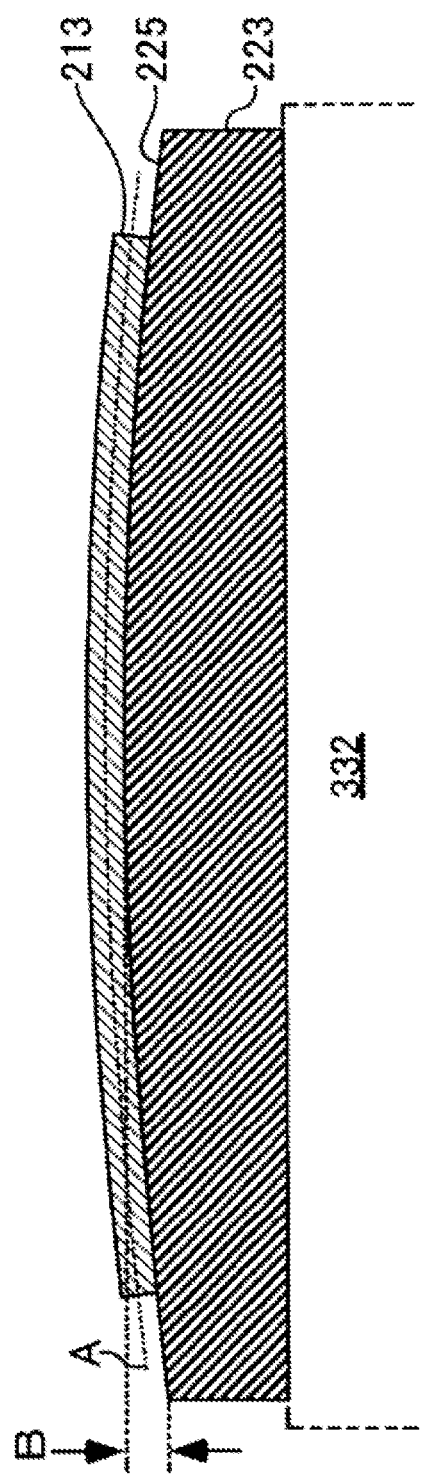
FIG. 6 is a schematic cross sectional view of a substrate holder 223 holding a substrate 213.

FIG. 6 is a schematic cross sectional view of a different substrate holder 223 holding a different substrate 213. A holding surface 225 of the substrate holder 223 protrudes at its middle, and there is a difference in height B generated between the middle of the holding surface 225 and its edge portions. This difference in height B is an exemplary degree of convexness of the substrate holder 223.

In addition, the substrate holder 223 has the function of suctionally attracting and holding the substrate 211 which is realized by an electrostatic chuck, vacuum chuck or the like. Therefore, the substrate 213 held by the substrate holder 223 has a shape with a protruding middle conforming to the shape of the holding surface 225. If a substrate 213 is mentioned in the following explanation, it refers to one that is held by a different substrate holder 223 among substrates 210 to be stacked.

If the substrate 213 is deformed as illustrated in the figure, the substrate 213 is extended above an alternate long and short dash line A indicating the middle of the substrate 213 in the thickness direction. Therefore, on the top surface (in the figure) of the substrate 213, the magnification of a circuit or the like formed on the surface of the substrate 213 relative to its designed dimension increases. On the other hand, on the lower side (in the figure) relative to the alternate long and short dash line A, the substrate 213 contracts, and the magnification of the bottom surface (in the figure) relative to its designed dimension decreases.

The magnifications mentioned here is one type of distortion which is deformation generated to the substrate 213. Distortion generated to the substrate 213 includes: components that have constant tendency over the entire substrate 213 such as magnification components that cause distortion in radial directions from the center of the substrate or orthogonal components; and non-linear components other than them. Orthogonal component distortion is for example distortion generated in opposite directions: in two regions that are divided by a line segment passing through the center of a substrate; and along a line segment passing through the center. The components of magnifications include those related to isotropic magnifications that generate the same amount of deformation in the X-direction and Y-direction, and those related to anisotropic magnifications that generate different amounts of deformation in the X-direction and Y-direction, and the anisotropic magnification components are included in the non-linear components.

These types of distortion are caused by: stress generated in processes of forming alignment marks 218 or circuit regions 216 in the substrate 210; anisotropy due to crystalline orientation of the substrate 210; constantly repetitive changes in rigidity due to the arrangement or the like of scribe lines 212, circuit regions 216 or the like; or the like. In addition, even if distortion is not generated to the substrate 210 before being bonded, in the course of bonding, the substrate 210 is deformed and distorted occasionally at the boundary between contact regions which are regions already contacting and non-contact regions which are regions yet to contact.

Magnifications to be corrected in the present example are isotropic magnifications, and are one of indices that are among the states of substrates measured at Step S101 and indicate extent of differences from a predetermined shape. In addition, magnifications are values (ppm) that represent differences in size from the design value of the substrate 210 in proportions of dimensions in the plane direction. Distortion including such magnifications is one type of shape-related information of the substrate 210.

In this manner, the substrate holder 223 having the difference in height B at the holding surface 225 can correct the substrate 213 to change its magnification by deforming the suctionally attracted substrate 213. Therefore, for example, if there is a magnification difference remaining as positional misalignment between the substrate 213 and the substrate 211 at the step at which alignment of the two substrates 211, 213 is completed or after they are stacked, correction to reduce a magnification difference between the substrates 211, 213 is performed by stacking the substrate 213 with its magnification being kept changed by the substrate holder 223, and positional misalignment between the substrates 211, 213 due to the magnification difference can be corrected.

Here, positional misalignment between the stacked substrates 211, 213 is positional misalignment between their corresponding alignment marks and their corresponding connection portions, and includes positional misalignment due to a difference between amounts of distortion resulting from deformation of the substrates 211, 213 such as warping.

In addition, positional misalignment also include positional misalignment due to deformation of the substrate 211 generated in the course of stacking the substrates 211, 213. That is, in the course of stacking the substrates 211, 213, they are joined by releasing holding of the one substrate 211 toward the different held substrate 213. Therefore, deformation generated in the course of joining to the released substrate 211 has influence also after being joined, and this causes positional misalignment.

The amount of correction of magnification correction of the substrate 213 by the substrate holder 223 changes according to the shape of the surface on which the substrate holder 223 holds the substrate 213. In the present example, it changes according to the degree of convexness relative to a flat plane. The degree of convexness represents a difference between the highest position and lowest position of the holding surface on which the substrate holder 220 holds the substrate 210 when the substrate holder 220 is placed horizontally, and, in the present example, is indicated by the difference in height B of at middle portion of the holding surface 225 from a plane of the holding surface 225 including its edge portions.

The above-mentioned curvature is the curvature of an arc of the holding surface 225 when the substrate holder 223 is seen along a longitudinal section passing through the center of the substrate holder 223. Even if degrees of convexness are the same, curvatures of holding surfaces 225 of substrate holders 223 are different if the sizes of the holding surfaces 225 are different. If substrates 213 are held by such substrate holders 223, amounts of correction of the substrates 213 are different from each other even if degrees of convexness are the same. Therefore, specifications of substrate holders 223 are stored to include: combinations of degrees of convexness and diameters; and amounts of correction, in combination with each other. Conversely, if it is known that the diameters of a plurality of substrate holders 223 are the same, an amount of correction of a substrate 213 held by each of the substrates holders 223 can be grasped based on the degree of convexness of the substrate holder 223.

Figure 7:
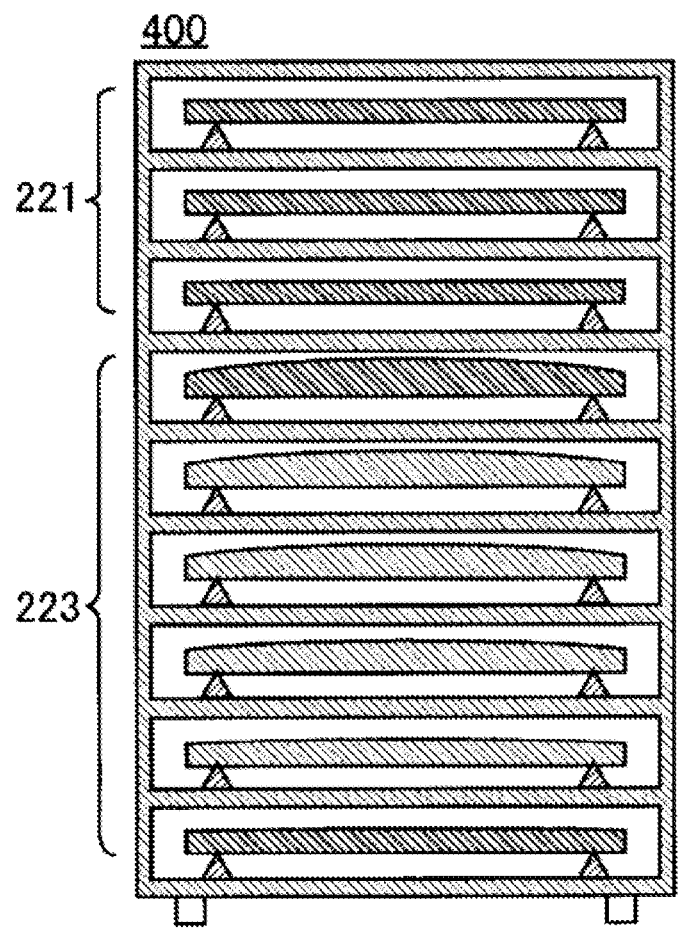
FIG. 7 is a schematic view of the holder stocker 400.

FIG. 7 is a schematic view of the holder stocker 400 housing substrate holders 223. A plurality of substrate holders 223 having holding surfaces 225 with degrees of convexness that are different from each other are housed in the holder stocker 400. In the example illustrated in the figure, individually different states of the plurality of substrate holders 223 are magnitudes of the degrees of convexness of their holding surfaces 225.

In the example illustrated in the figure, the range of the amounts of correction that can be made with the entire plurality of substrate holders 223 is −10 ppm to +10 ppm. This range is a range of correction that can be made for a remaining amount of misalignment when, for example, both a substrate holder 223 and another correcting mechanism are used, and an amount of misalignment that cannot be corrected by the correcting mechanism is corrected by the substrate holder 223. Here, the correcting mechanism for example is a mechanism that: includes a plurality of actuators that can extend or contract, a plurality of pneumatic units or the like that are arranged on a plane; and deforms a substrate supported by the plurality of actuators or plurality of pneumatic units into a desired shape by driving them. A difference between an amount of correction set to each of the plurality of substrate holders 223 and an amount of correction that should actually be made may be calculated by the holder selecting unit 151, and in the state where a substrate which is a to-be-corrected object is held by a substrate holder 223, the substrate and substrate holder 223 may be deformed by the correcting mechanism to thereby compensate for the difference with the correcting mechanism. The relationship between degrees of convexness or substrate holders 223 and amounts of correction is preset and stored, and an amount of correction of a substrate holder 223 with a degree of convexness of 1 μm is 0.08 ppm, for example. In addition, the range of pitch of amounts of correction of the plurality of substrate holders 223 is 0.1 to 1 ppm, and the pitch may be constant or differ among the plurality of substrate holders 223.

According to the state of a substrate 211, that is, a result of measurement at the prealigner 500, the holder selecting unit 151 selects a substrate holder 223 having a holding surface 225 with a degree of convexness that can correct a substrate 213 to be in a state that a difference between a magnification of the one substrate 211 estimated based on a preliminarily stored relationship between warp amounts and magnifications, and a magnification of the different substrate 213 estimated from a measurement result of the substrate 213, that is, an amount of positional misalignment between the two substrates 211, 213, does not exceed a predetermined threshold.

The magnification of the substrate 213 can also be known from measured positions of alignment marks of the substrate 213. If a magnification is estimated based on a result of measurement about the shape of the substrate 213, both changes in a magnification due to deformation of the substrate 211 generated in the course of stacking and a difference in magnifications due to deformation generated to the two substrates 211, 213 individually in the course of manufacturing before stacking the two substrates 211, 213 may be estimated, and an amount of correction may be determined based on both of them.

A warp amount of a substrate 213 is one of indices indicating an extent of a difference from a predetermined shape among states of a substrate measured at Step S101, and particularly is a value indicating an amount of deformation in the direction of the thickness of a substrate 210. The warp amount mentioned here is an amount of deformation in the direction of the thickness of a substrate minus a component of an amount of deformation generated due to an external force like gravity to act on the substrate 210, and is distinguished from an amount of bending including also an amount of deformation due to an external force.

If physical properties of the substrate 210 such as a bending strength are grasped preliminarily, it is possible to predict or estimate a warp amount of the substrate 210 from an amount of bending of the substrate 210. A component of an amount of deformation due to an external force to act on the substrate 210 can be detected by measuring an amount of deformation of an unwarped substrate 210 by the same method and under the same condition as those for a warped substrate 210. Such a warp amount and amount of bending are one type of shape-related information of the substrate 210.

In addition, if a plurality of substrate holders 223 having holding surfaces 225 with different magnitudes of curvature as their states are used, the holder selecting unit 151 may select, from the plurality of substrate holders 223, a substrate holder 223 having a curvature corresponding to an amount of correction that is to be made between substrates 211, 213 to be stacked. Amounts of correction and curvatures or substrate holders 223 are preliminarily stored in association with each other. An amount of correction that should be made by a substrate holder 223 is determined according to a combination of two substrates 211, 213 to be stacked, and for example is calculated from a magnification difference between the two substrates 211, 213. In the present example, the holder selecting unit 151 functions as a calculating unit to calculate an amount of correction.

The holder selecting unit 151 may select a substrate holder 223 using not a result of measurement by the prealigner 500 but another determination criterion.

For example, if there is a measurement value about the state of a substrate 213 carried into the stacking unit 300 that is already measured by a processing apparatus outside the stacking unit 300, for example, an exposure apparatus, a polishing apparatus, a film-forming apparatus or the like, the holder selecting unit 151 may acquire the measurement value and use it as a selection criterion. The measurement value used here for example includes a magnification value, an amount of deformation (a warp amount, an amount of bending or the like), an amount of correction that needs to be made between two substrates 211, 213, and the like, which is shape-related information of each of the two substrates 211, 213.

In addition, if there are characteristics that should be corrected, appearing qualitatively based on contents of a process upstream of the stacking unit 300 like a film-formation process, a manufacturing device used in this upstream process, the structure of a substrate 213 and the like, they may be uses as preconditions of a criterion in selecting a substrate holder 223. For example, warp amounts of or amounts of bending of substrates are comparable, and amounts of correction that should be made are comparable if those substrates are substrates belonging to the same lot, substrates manufactured in the same process, or substrates that share a processing history such as a processing apparatus used in a process, information about the lot, process, processing history or the like may be received from a processing apparatus, and a substrate holder 223 may be selected for replacement based on the received information. In this case, substrate holders 223 to be used may be replaced lot-by-lot or processing history-by-processing history.

Furthermore, as a process separate from a stacking process, the state of a substrate 213 may be measured using measurement devices other than the prealigner 500 provided to the stacking unit 300, for example, microscopes 324, 334 in the stacking unit 300 or the like. Thereby, other than a state that appears to an appearance of a substrate 213 as deformation or the like, the distribution of residual stress in the substrate 213 or the like can be a to-be-corrected characteristic.

Although in the above-mentioned example, warping of a substrate 210 is measured using the prealigner 500, it may be measured by a different method. For example, deformation of a substrate 213 in the plane direction can be measured by causing any predetermined substrate holder 223 to hold the substrate 213 and executing enhanced global alignment at the stacking unit 300 using alignment marks 218 provided to the substrate 213 as index marks. Based on a result of this measurement, at least one of the amount of positional misalignment between two substrates 211, 213 and the amount of correction therefor may be predicted, and a substrate holder 223 corresponding to those amounts may be selected by the holder selecting unit 151, or amounts of deformation which are measurement results and substrate holders 223 may be associated with each other in advance or amounts of deformation and amounts of correction may be associated with each other in advance, and a substrate holder 223 may be selected by the holder selecting unit 151 according to an amount of deformation. The amount of positional misalignment between two substrates 211, 213 and the amount of correction therefor are each one type of information about two substrates 211, 213.

In addition, if the amount of positional misalignment between alignment marks 218 on substrates 211, 213 that are already stacked and joined or the like is measured, and a different substrate 211 or 213 having a common specification is stacked, the holder selecting unit 151 may select a substrate holder 223 to use based on the measurement result. Furthermore, in measurement of joined substrates 211, 213, a warp amount or amount of bending may be measured, instead of a positional misalignment amount. In this case, the holder selecting unit 151 may select a substrate holder 223 based on a preliminarily stored relationship between warp amounts and misalignment amounts.

Furthermore, when selecting a substrate holder 223, the holder selecting unit 151 may acquire information about factors to cause fluctuation of magnifications generated to substrates 211, 213 such as temperature changes during joining processes or changes in conditions of activation of substrates 211, 213, and based on these types of information, may review a result of selection based on a measured positional misalignment amount, warp amount or bending amount.

In this manner, the stacking apparatus 100 includes a plurality of substrate holders 223 that have degrees of convexness that are different from each other and can provide amounts of correction of substrates 213 that are different from each other. Each of the plurality of substrate holders 223 corrects the states of substrates 213 in amounts of correction that are different from each other. That is, the plurality of substrate holders 223 causes deformation of substrates 213 by amounts that are different from each other when they are held by the plurality of substrate holders 223, and make amounts of changes in shapes of the substrates 213 before and after the holding different from each other.

Referring to FIG. 2 again, substrate holders 221, 213 individually holding substrates 211, 213 to be placed one on another at Step S102 are sequentially carried into the stacking unit 300 (Step S104).

Figure 8:
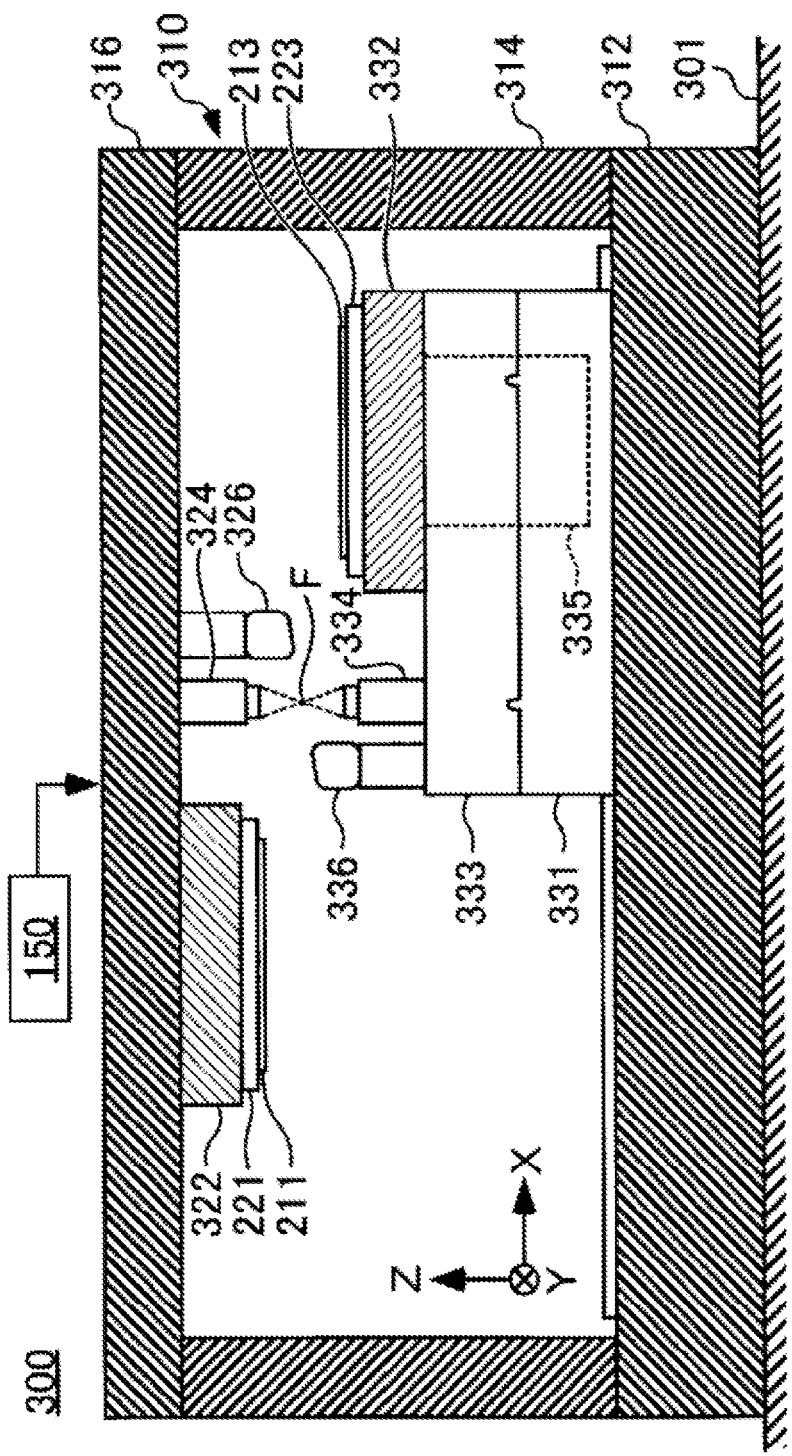
FIG. 8 is a schematic cross sectional view of a stacking unit 300.

FIG. 8 shows how it appears after the substrate holder 221, 213 holding the substrates 211, 213 are carried into the stacking unit 300, together with the structure of the stacking unit 300. The stacking unit 300 in the stacking apparatus 100 includes a frame body 310, a fixation stage 322 and a moving stage 332.

The frame body 310 has a base plate 312 and a top plate 316 that are parallel with a floor surface 301, and a plurality of supports 314 that are vertical to the floor plate.

The fixation stage 322 fixed to the bottom surface (in the figure) of the top plate 316 facing downward has the hold function which is realized by a vacuum chuck, an electrostatic chuck or the like. As illustrated in the figure, the substrate 211 is held by the fixation stage 322 together with the substrate holder 221 having a flat holding surface 225.

A microscope 324 and an activating apparatus 326 are fixed to the bottom surface of the top plate 316. The microscope 324 enables observation of the top surface of the substrate 213 held by the moving stage 332 arranged to face the fixation stage 322. The activating apparatus 326 generates plasma to activate the top surface of the substrate 213 held by the moving stage 332.

The moving stage 332 is mounted on a Y-direction drive unit 333 that moves in the direction indicated by the arrow Y in the figure. The Y-direction drive unit 333 is placed on an X-direction drive unit 331 disposed on the base plate 312. The X-direction drive unit 331 moves in the direction indicated by the arrow X in the figure, in parallel with the base plate 312. Thereby, the moving stage 332 can move in the X-Y-direction two-dimensionally. A substrate 213 held by the substrate holder 223 is held by the moving stage 332 illustrated in the figure. As has been explained with reference to FIG. 6, the substrate holder 223 has a curved holding surface 225, and the substrate 213 also is held in a state where it is corrected along the holding surface 225.

In addition, the moving stage 332 rises and lowers relative to the Y-direction drive unit 333 due to a Z-direction drive unit 335 that rises and lowers in the direction indicated by the arrow Z.

The amount of movement of the moving stage 332 realized by the X-direction drive unit 331, Y-direction drive unit 333 and Z-direction drive unit 335 is minutely measured using an interferometer or the like. In addition, the X-direction drive unit 331 and Y-direction drive unit 333 may each be configured to have two stages consisting of a coarse movement unit and a fine movement unit. Thereby, both highly precise alignment and high throughput can be achieved to make it possible to join the substrate 211 mounted on the moving stage 332, moving the substrate 211 fast without lowering control precision.

On the Y-direction drive unit 333, a microscope 334 and an activating apparatus 336 are individually further mounted laterally next to the moving stage 332. The microscope 334 enables observation of the downward-facing bottom surface of the substrate 213 held by the fixation stage 322. The activating apparatus 336 generates plasma to activate the bottom surface of the substrate 213 held by the fixation stage 322.

The stacking unit 300 may further include a rotation drive unit that rotates the moving stage 332 about a rotation axis vertical to the base plate 312 and an oscillation drive unit that oscillates the moving stage 332. Thereby, the precision of aligning the substrates 211, 213 can be improved by rotating the substrate 211 held by the moving stage 332, as well as by making the moving stage 332 parallel with the fixation stage 322.

The control unit 150 preliminarily calibrates the microscopes 324, 334 by adjusting the foci of the microscope 324, 334 to match each other, causing them to observe a common index mark, and so on. Thereby, the relative positions of the pair of microscopes 324, 334 in the stacking unit 300 are measured. Next, referring to FIG. 2 again, alignment marks formed in each of the substrates 211, 213 are detected in the stacking unit 300 (Step S105).

Figure 9:
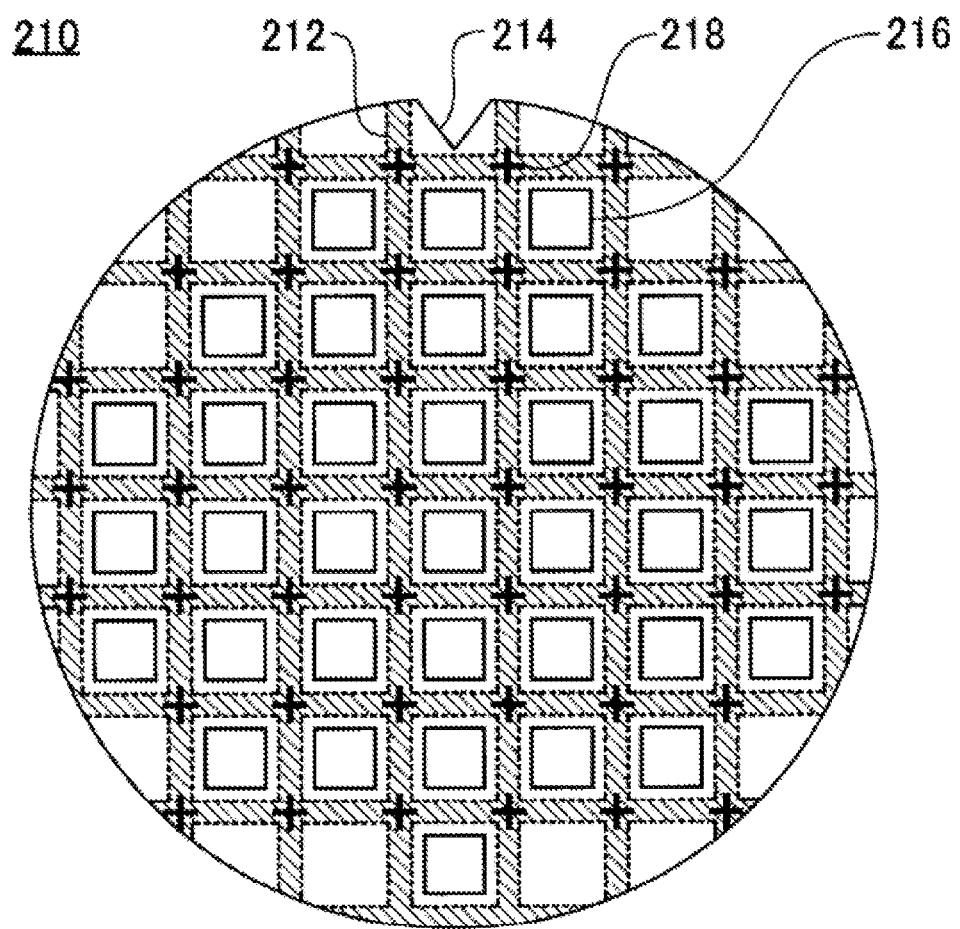
FIG. 9 is a schematic plan view of a substrate 210.

FIG. 9 is a schematic plan view of a substrate 210 (211, 213) to be placed on a different substrate in the stacking apparatus 100. The substrate 210 has: a notch 214; and a plurality of circuit regions 216 and a plurality of alignment marks 218.

The circuit regions 216 are disposed on a surface of the substrate 210 constantly repetitively in the plane direction of the substrate 210. Each of the circuit regions 216 is provided with a semiconductor device, wire, protection film or the like formed by a photolithography technique or the like. Also in the circuit regions 216 are disposed structures including connection portions such as pads or bumps to serve as connection terminals if the substrate 210 is to be electrically connected to a different substrate 210, a lead frame or the like.

The alignment marks 218 are an exemplary structure formed on a surface of the substrate 210, and are disposed to overlap scribe lines 212 disposed between the circuit regions 216. The alignment marks 218 are utilized as index marks in aligning this substrate 210 with a different substrate 210 which is a to-be-stacked object.

Figure 10:
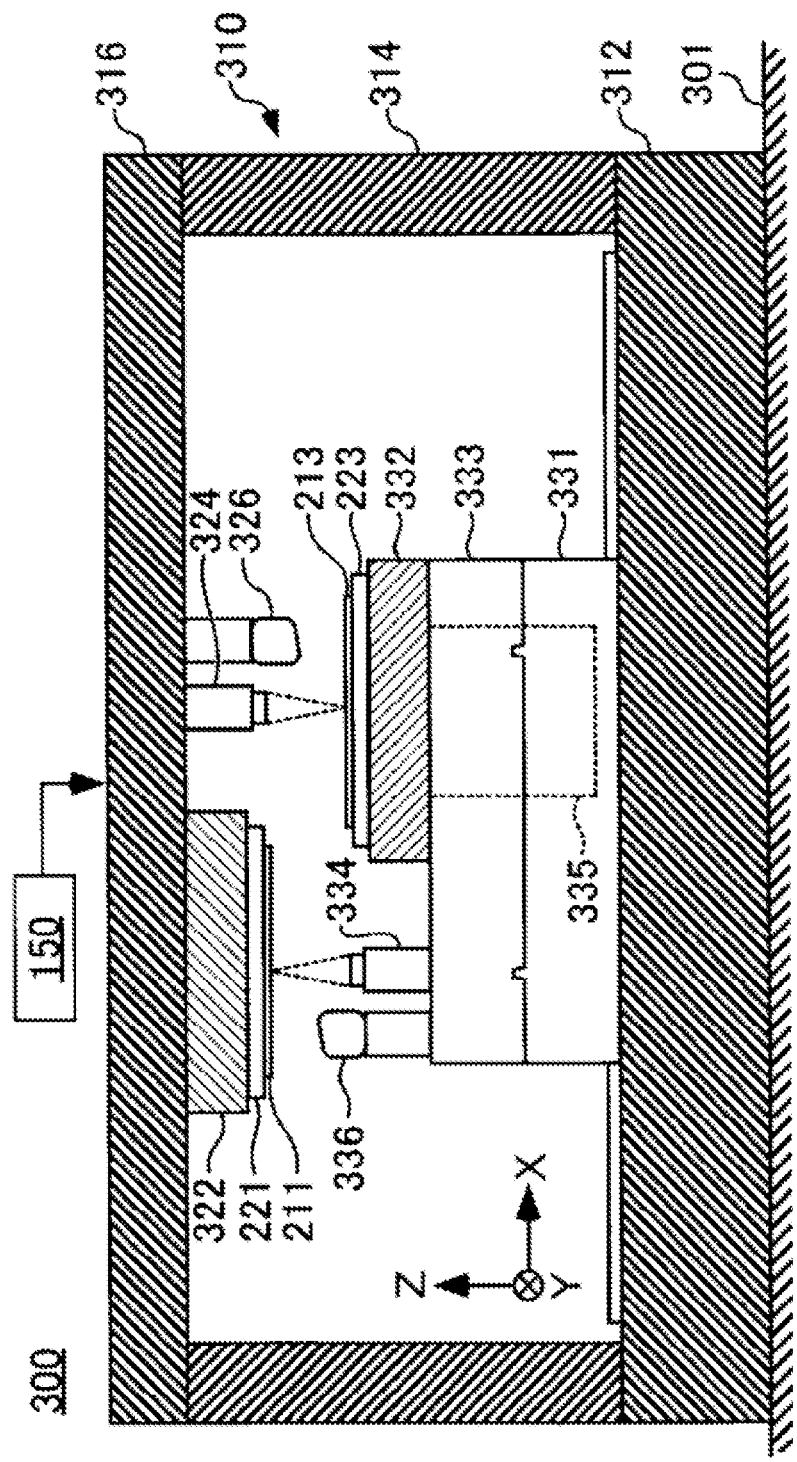
FIG. 10 is a schematic cross sectional view of the stacking unit 300.

FIG. 10 is a figure for explaining operation of the stacking unit 300 at Step S105. At Step S105, the control unit 150 operates the X-direction drive unit 331 and Y-direction drive unit 333 to detect, using the microscopes 324, 334, alignment marks 218 provided to the individual substrates 211, 213.

In this manner, by detecting the positions of the alignment marks 218 of the substrates 211, 213 using the microscopes 324, 334 whose relative positions are known, the control unit 150 can calculate the relative positions of the substrates 211, 213 (Step S106). That is, in the stacking unit 300, an amount of movement of the moving stage 332 is calculated such that the detected positions of the alignment marks 218 match or corresponding circuit regions 216 overlap one on another.

FIG. 2 is referred to again. Next, the control unit 150 activates joint surfaces of the substrates 211, 213 to be stacked (Step S107).

Figure 11:
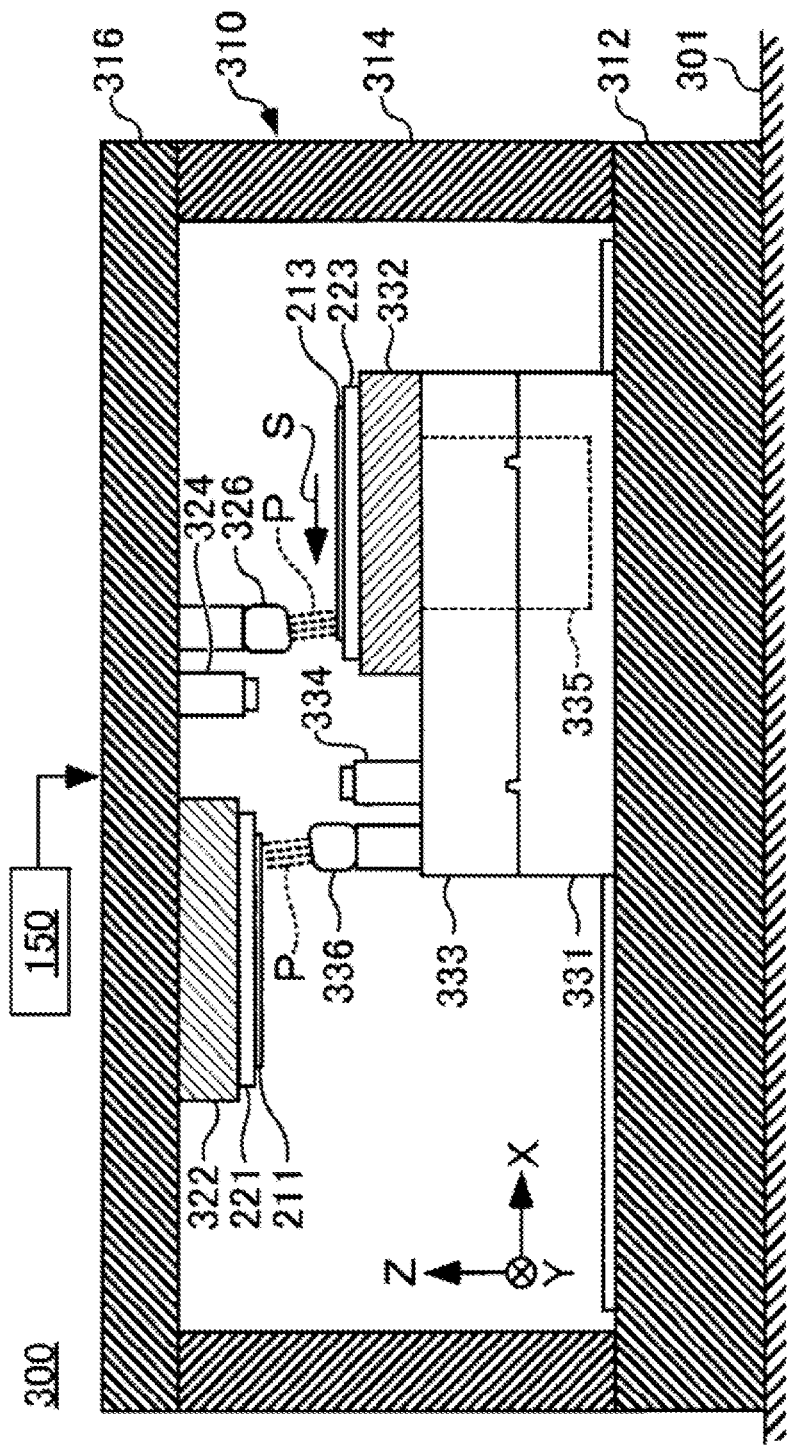
FIG. 11 is a schematic cross sectional view of the stacking unit 300.

FIG. 11 is a figure for explaining operation of the stacking unit 300 at Step S107. At Step S107, the control unit 150 chemically activates a joint surface of each among the pair of substrates 211, 213 while at the same time maintaining the relative positions of the pair of substrates 211, 213.

The control unit 150 first resets the position of the moving stage 332 to its initial position, then moves horizontally, and causes the activating apparatuses 326, 336 to scan surfaces of the substrates 211, 213 with plasma generated thereby.

Thereby, the individual surfaces of the substrates 211, 213 are purified and become chemically highly active. Therefore, the substrates 211, 213 autonomously suctionally attract each other and join with each other by being in contact with or approaching each other.

The activating apparatuses 326, 336 radiate plasma P in directions away from the individual microscopes 324, 334. Thereby, it is possible to prevent the microscopes 324, 334 from being contaminated by fragments generated by the substrates 211, 213 irradiated with plasma.

In addition, although the stacking unit 300 illustrated in the figure includes the activating apparatuses 326, 336 to activate the substrates 211, 213, a different structure from which the activating apparatuses 326, 336 of the stacking unit 300 are omitted can also be employed, which structure is made possible by carrying, into the stacking unit 300, the substrates 211, 213 that are activated preliminarily using the activating apparatuses 326, 336 provided separately from the stacking unit 300.

Furthermore, besides a method of exposing substrates 211, 213 to plasma, substrates 211, 213 can be activated by sputter-etching using an inert gas, an ion beam, a fast atomic beam or the like, or a mechanical process such as polishing or the like. If an ion beam or fast atomic beam is used, the stacking unit 300 can be generated under a reduced pressure. Still furthermore, substrates 211, 213 can also be activated by ultraviolet light irradiation, an ozone asher or the like. Furthermore, surfaces of substrates 211, 213 may also be activated by chemically purifying them using a liquid or gas etchant, for example.

Figure 12:
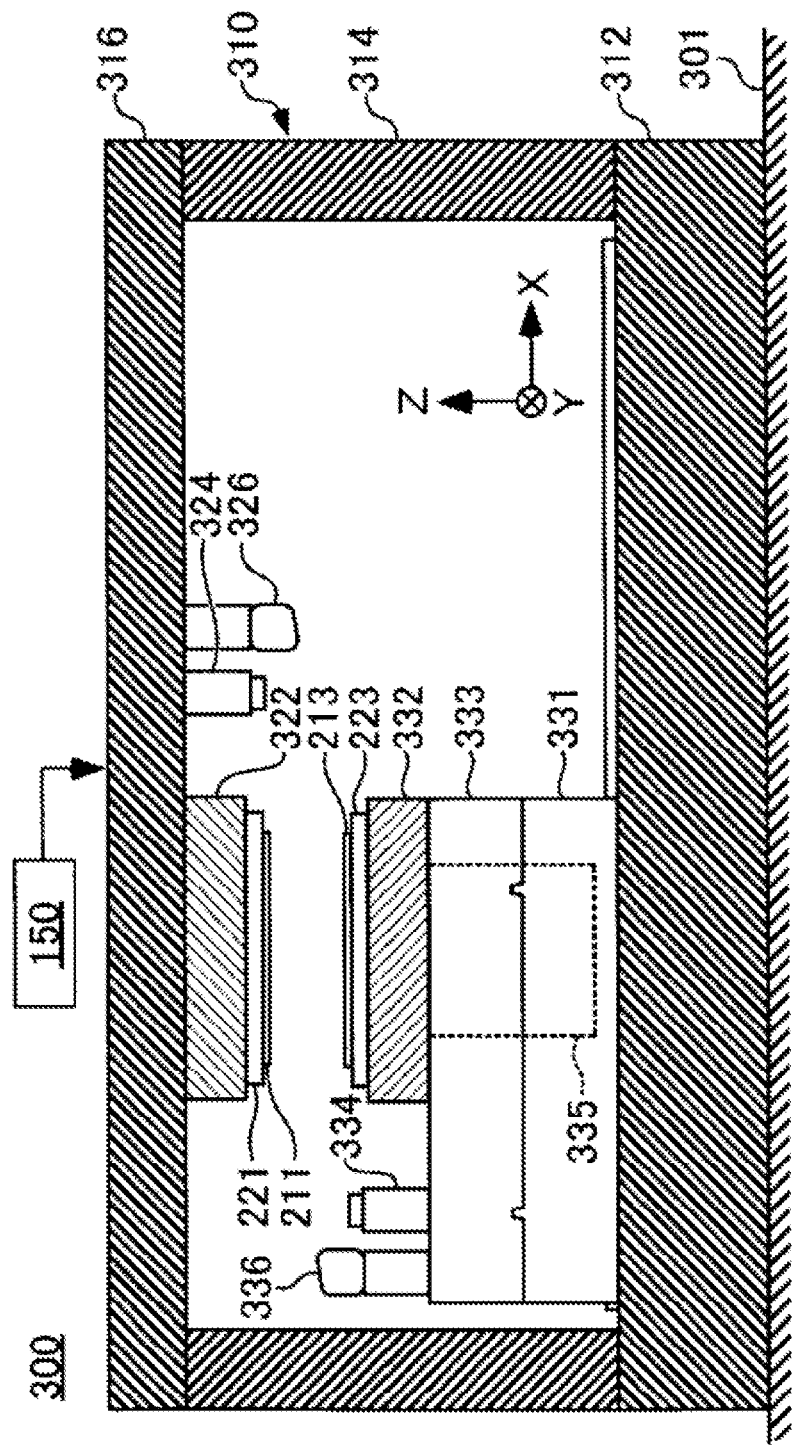
FIG. 12 is a schematic cross sectional view of the stacking unit 300.

FIG. 2 is referred to again. Next, the control unit 150 moves the moving stage 332 based on the amount of movement calculated at Step S106, and aligns the substrates 211, 213 as shown in FIG. 12 (Step S108).

Figure 13:
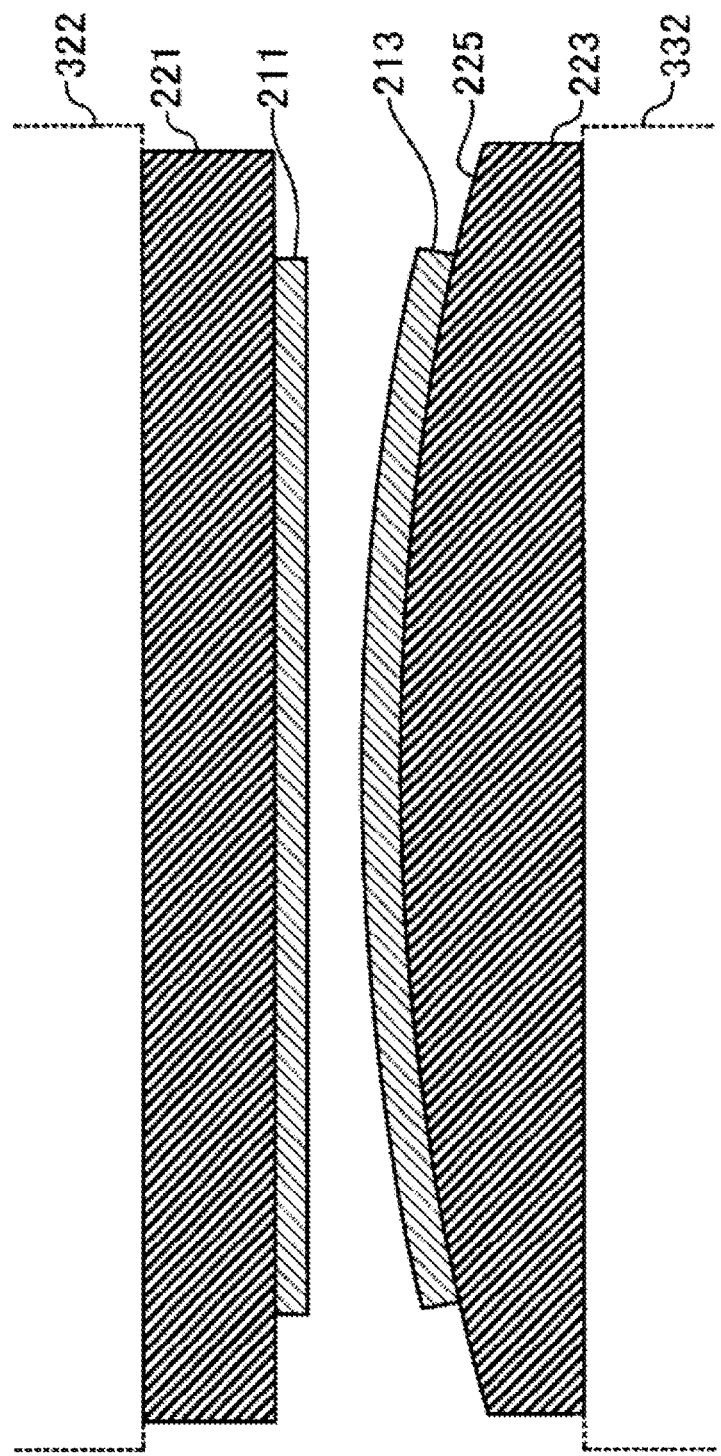
FIG. 13 is a schematic view showing how substrates 211, 213 appear in the stacking unit 300.
Figure 14:
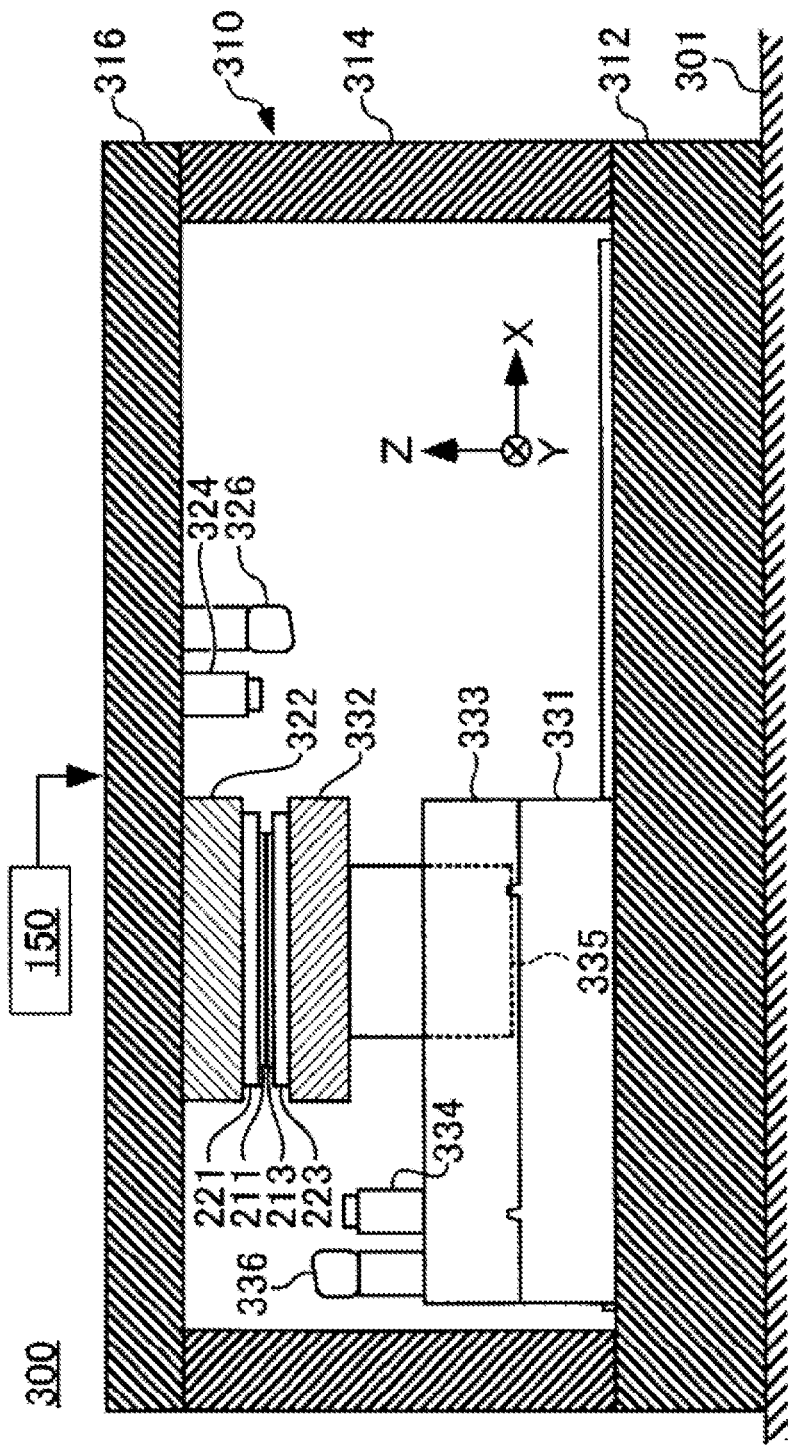
FIG. 14 is a schematic cross sectional view of the stacking unit 300.

FIG. 13 is a schematic view showing how the substrates 211, 213 aligned with each other at Step S108 appear. Next, as shown in FIG. 14, the control unit 150 raises the moving stage 332 by the Z-direction drive unit 335, bring the aligned substrates 211, 213 into contact with each other and starts joining of the substrates 211, 213 (Step S109).

Figure 15:
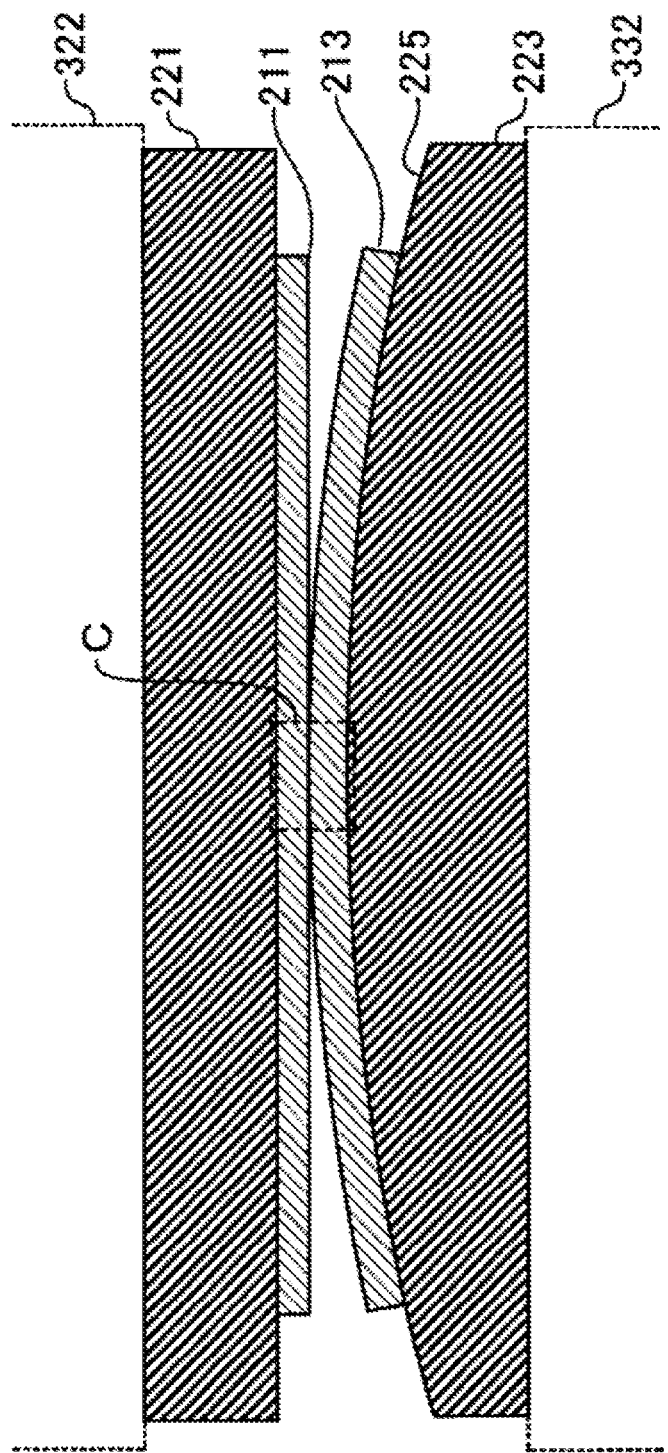
FIG. 15 is a schematic view showing how the substrates 211, 213 appear in the stacking unit 300.

As shown in FIG. 15, at the time point at which they come into contact at Step S109, the one flat substrate 211 and the different curved substrate 213 contact at one part. Thereby, as indicated by a region surrounded by the dotted line C in the figure, a joint starting point at which the substrates 211, 213 are joined partially is formed at the approximately middles of the substrates 211, 213.

Figure 16:
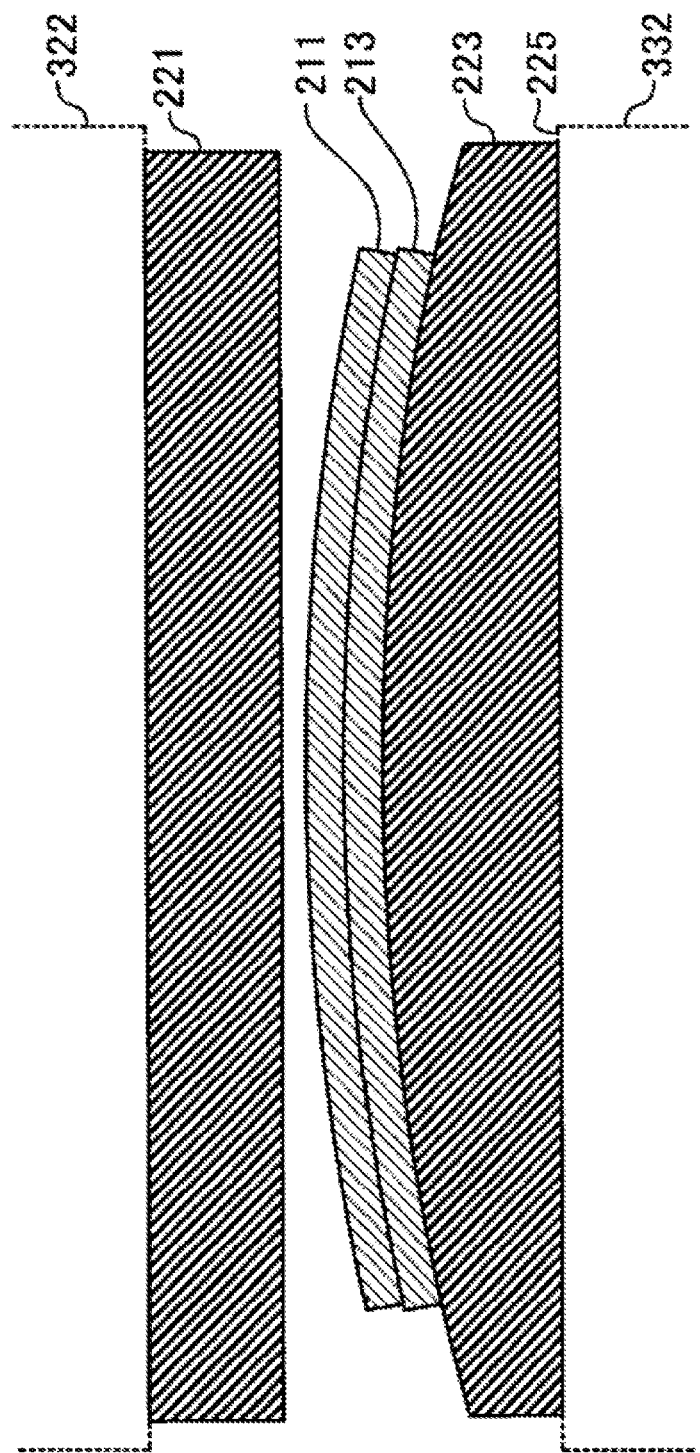
FIG. 16 is a schematic view showing how the substrates 211, 213 appear in the stacking unit 300.

As shown in FIG. 16, after parts of the substrates 211, 213 come into contact, the control unit 150 discontinues holding of the substrate 211 by the substrate holder 221 at the fixation stage 322. The substrate 211 that is located on the upper side in the figure and is freed thereby autonomously enlarges its joined region due to its own weight and an intermolecular force of the activated substrates 211, 213 themselves, and eventually is joined entirely. In this manner, a stacked body 230 consisting of the substrates 211, 213 is formed in the stacking unit 300.

In the stacked body 230, the substrate 213 located on the lower side in the figure is kept being held by the substrate holder 223 having a curved holding surface 225 throughout the course of stacking at and after Step S103. Therefore, because the substrate 213 is joined with the substrate 211 in a state where it is corrected by the substrate holder 223, a magnification difference between the substrates 211, 213 is corrected.

In the course of enlargement of the contact regions of the substrates 211, 213 in the above-mentioned manner, the control unit 150 may partially or entirely discontinue holding of the substrate 213 by the substrate holder 223. In addition, holding of the substrate holder 223 by the fixation stage 322 may be discontinued. If holding of the substrate 213 is discontinued, in the course of enlargement of the contact regions, the substrate 213 located on the lower side floats above the substrate holder 223 and curves due to a pulling force from the substrate 211 located on the upper side. Thereby, because the shape changes to extend a surface of the substrate 213 located on the lower side, the difference from the extension amount of a surface of the substrate 211 located on the upper side decreases by the former extension amount.

Accordingly, positional misalignment due to the amounts of deformation that are different between the two substrates 211, 213 is suppressed. Because a floating amount of the substrate 213 from the substrate holder 223 can be adjusted by adjusting the holding force of the substrate holder 223, if a difference occurs between an amount of correction preset for a plurality of substrate holders 223 and an actually necessary amount of correction, the difference can be compensated for by adjusting the holding force of this substrate holder 223. The difference between the amounts of correction is for example calculated by the holder selecting unit 151.

Furthermore, joining of the substrates 211, 213 may be allowed to proceed without releasing the substrate 211 held by the fixation stage 322 but by releasing the substrate 213 held by the moving stage 332. Furthermore, the substrates 211, 213 may be joined by bringing the fixation stage 322 and the moving stage 332 close to each other while at the same time keeping the substrates 211, 213 held by the fixation stage 322 and the moving stage 332, individually.

The thus-formed stacked body 230 is carried out of the stacking unit 300 by the carrying unit 140 (Step S110), and housed in the substrate cassette 130.

Figure 17:
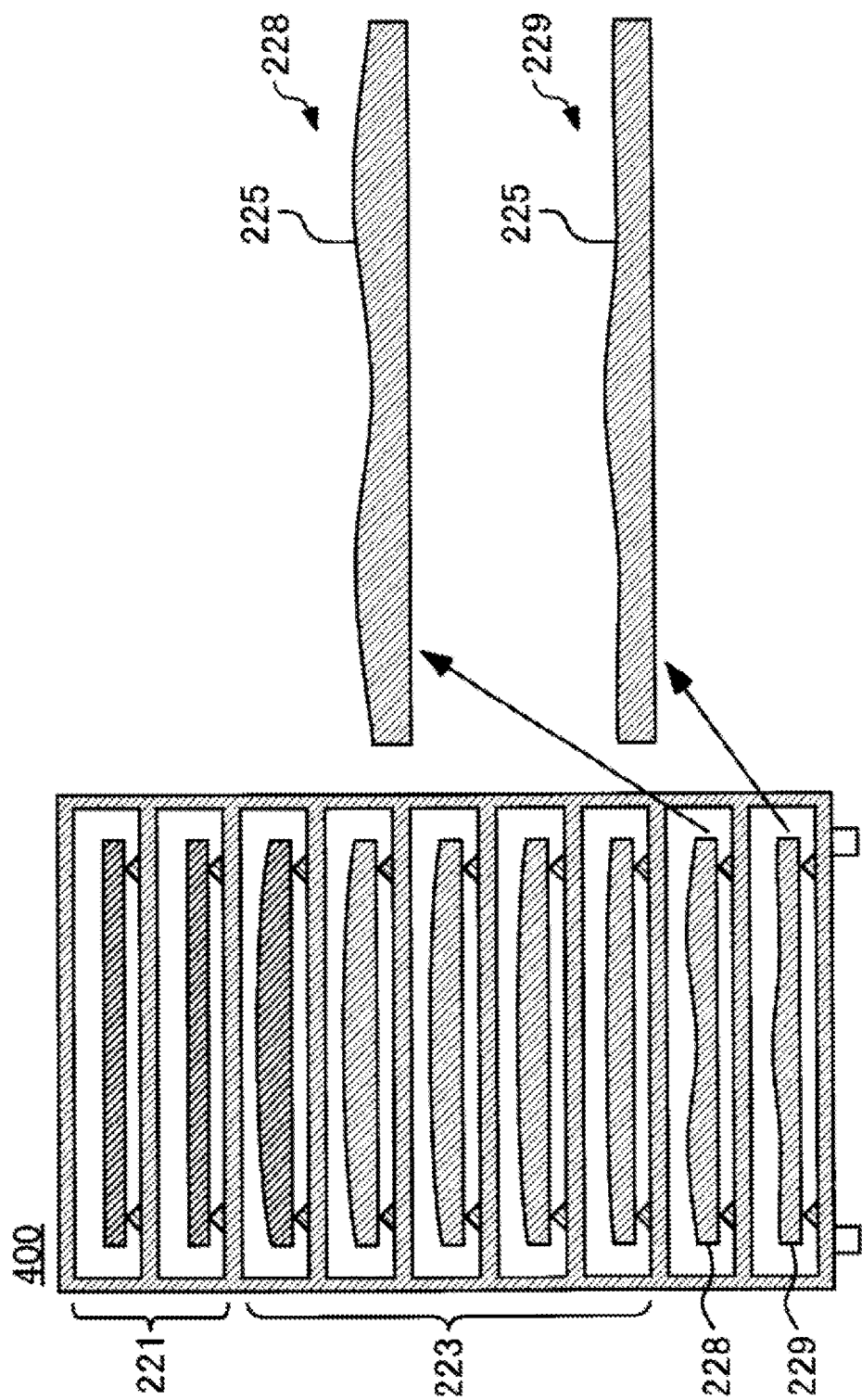
FIG. 17 is a schematic view of the holder stocker 400.

FIG. 17 is a schematic view of the holder stocker 400 housing a different holder lineup including substrate holders 228, 229. The holder lineup housed in the holder stocker 400 illustrated in the figure includes the substrate holder 228, 229 having non-spherical holding surfaces 225, in addition to substrate holders 221 having flat holding surfaces 225 and substrate holders 223 having spherical or paraboloidal holding surfaces 225.

The substrate holder 228 has a holding surface 225 whose middle and regions around the middle are dented. In addition, the substrate holder 229 has a holding surface whose curvature at the middle and regions around the middle is smaller than other regions. In this manner, by including the substrate holder 228 having a holding surface 225 with a non-linearly curved surface whose shape, curvature or the like partially changes in a lineup, in addition to the substrate holders 223 having a holding surface 225 with an entirely uniformly linearly curved surface, non-linear components among components of distortion generated to a substrate 213 can also be corrected. Therefore, for example, if particular deformation occurs for reasons related to the structure of a substrate 213 to be stacked, a manufacturing process thereof, a manufacturing apparatus therefor or the like, a substrate holder 220 to correct it can be prepared, and the substrate 213 can be corrected by it.

Furthermore, a linear component and a non-linear component may be corrected at once by using the above-mentioned substrate holders 228, 229 that can correct non-linear components by placing them on or under a substrate holder that can correct linear components such as an isotropic magnification or correction stages 341, 342, 343, 344, 345, 346 mentioned below.

The shapes of holding surfaces 225 formed on the substrate holders 223, 228, 229 are not limited to symmetrical shapes like the ones mentioned above, but may be eccentric shapes, cylindrical shapes or the like. In addition, other than a convex shape in which the middle of a holding surface 225 protrudes toward a substrate 213, the holding surface 225 may have a concave shape with protruding circumference. Furthermore, although in the above-mentioned implementation, a plurality of substrate holders 223 each have a different degree of convexness, instead of this, a plurality of substrate holders 223 each having different curvature may be used.

Furthermore, other than correction by the shape of a holding surface 225 or in addition to correction by the shape of a holding surface 225, the shape of a substrate 213 may be changed by using a plurality of substrate holders that are different from each other in terms of at least one of the levels of temperatures at holding surfaces 225, the degrees of surface roughness of holding surfaces 225 of substrate holders relative to substrates 213 and the strengths of holding forces of holding surfaces 225, as the state of substrate holders.

If a plurality of substrate holders having temperatures that are different from each other are used, substrates 213 held by the substrate holders thermally deform by amounts of deformation corresponding to the temperatures of the substrate holders. The temperatures of the plurality of substrate holders may be adjusted using heaters or the like incorporated into each of the plurality of substrate holders, or each of the plurality of substrate holders may be adjusted to an individually different temperature by a heater provided to the holder stocker 400. A relationship between substrate holders and amounts of correction or a relationship between temperatures of substrate holders and amounts of correction is preset and stored.

The holder selecting unit 151 selects a substrate holder having a temperature corresponding to an amount of correction that should be made, based on at least one of: measured amounts of deformation of the two substrates 211, 213; a magnification difference between the substrates 211, 213 estimated from the deformation amount measurement result; an amount of positional misalignment between the two substrates 211, 213; and amounts of correction of the two substrates 211, 213.

If a plurality of substrate holders having holding surfaces to hold substrates with surface roughness that are different from each other are used, a relationship between amounts of correction and surface roughness or a relationship between amounts of correction and substrate holder are preset and stored. The surface roughness is for example arithmetic mean roughness (Ra).

In the course of stacking the substrate 213 onto the substrate 211, the released substrate 211 expands in the plane direction, and during that process, the held substrate 213 is joined. Therefore, the restoration force of the released substrate 211 acts on the contractile force of the held substrate 213. Therefore, depending on the strength of the friction force of a substrate holder to act on the substrate 213, an amount of contraction due to the contractile force to act on the held substrate 213 also differs. Accordingly, according to the friction force to act on the substrate 213, the contractile force to act on the substrate 213 is controlled, and a magnification generated to the substrate 213 at the time of joining can be changed.

The friction force to act from the holding surface on the substrate 210 is not determined by the nature of a surface of the substrate holder 220 singly, but it is determined by the sum of the nature of the holding surface of the substrate holder 220, the state of a surface of the substrate 210 and the weight of the substrate 210 applied onto the substrate holder 220. Therefore, if an amount of correction is adjusted by the friction force acting between the substrate 210 and the substrate holder, the friction force that is generated between the substrate 210 and the substrate holder 220 is predicted based on the surface roughness of the substrate 210 held by the substrate holder 220, and a substrate holder 220 to hold the substrate 210 is selected based on it.

The friction forces of the substrate holders 223, 228, 229 to act on the substrate 213 can be adjusted not only by surface roughness but also for example by materials, rigidity or the like of the substrate holders 223, 228, 229.

The holder selecting unit 151 selects a substrate holder having a holding surface with surface roughness corresponding to an amount of correction that should be made, based on at least one of: measured amounts of deformation of the two substrates 211, 213; a magnification difference between the substrates 211, 213 estimated from the deformation amount measurement result; an amount of positional misalignment between the two substrates 211, 213; and amounts of correction of the two substrates 211, 213.

In addition, if a plurality of substrate holders having holding surfaces with holding forces that are different from each other are used, a relationship between amounts of correction and holding forces or a relationship between amounts of correction and substrate holder are preset and stored. The force of the substrate holder 220 to hold a substrate 210 can be measured not based on methods of suctional attraction such as electrostatic suctional attraction or vacuum suctional attraction but by a suctional attraction force [kPa] to act on the substrate 210.

In the course of stacking a substrate 213 onto a substrate 211, an amount by which the substrate 213 separates from a substrate holder changes according to the holding force, due to the intermolecular force that the held substrate 213 receives from the substrate 211. When part of the held substrate 213 separates from the substrate holder, the substrate 213 is joined with the different substrate 211 while being deformed to be convex toward it. Therefore, distortion comparable to a change in distortion including a magnification due to deformation generated to the released substrate 211 in the course of joining can be generated to the held substrate 213. That is, an amount of separation of the substrate 213 from the holding surface is controlled according to the magnitude of the force to hold the substrate 213, and distortion generated to the substrate 213 at the time of joining can be changed.

The force of the substrate holder to hold the substrate 213 is set by adjusting voltage if it is held using an electrostatic suctional attraction force, and is set by adjusting a vacuum force of fluid if it is held using a vacuum suctional attraction force.

The holder selecting unit 151 selects a substrate holder having a holding force corresponding to distortion desired to be generated to the substrate 213 in the course of joining, based on at least one of: measured amounts of deformation of the two substrates 211, 213; a magnification difference between the substrates 211, 213 estimated from the deformation amount measurement result; an amount of positional misalignment between the two substrates 211, 213; and amounts of correction of the two substrates 211, 213.

In this manner, if a plurality of substrate holders that are different from each other in at least one of temperatures of the substrate holders, surface roughness of holding surfaces of the substrate holders and holding forces are used, amounts of correction to correct positional misalignment generated in the course of stacking a substrate 213 onto a substrate 211 can be changed. Therefore, by using a substrate holder having a holding surface in a state corresponding to the amount of correction, the substrate 213 can be corrected by an appropriate amount of correction to reduce positional misalignment between the substrates 211, 213.

If temperatures, surface roughness and holding forces of substrate holders are made different, their holding surfaces may be flat or may form convex shapes like the one shown in FIG. 6. By combining convex shapes and adjustment of temperatures, adjustment of surface roughness or adjustment of holding forces, if a plurality of substrate holders with different degrees of convexness are used, the substrate 213 can be corrected by amounts of correction that are different by pitches of amounts of correction corresponding to individual degrees of convexness.

Figure 18:
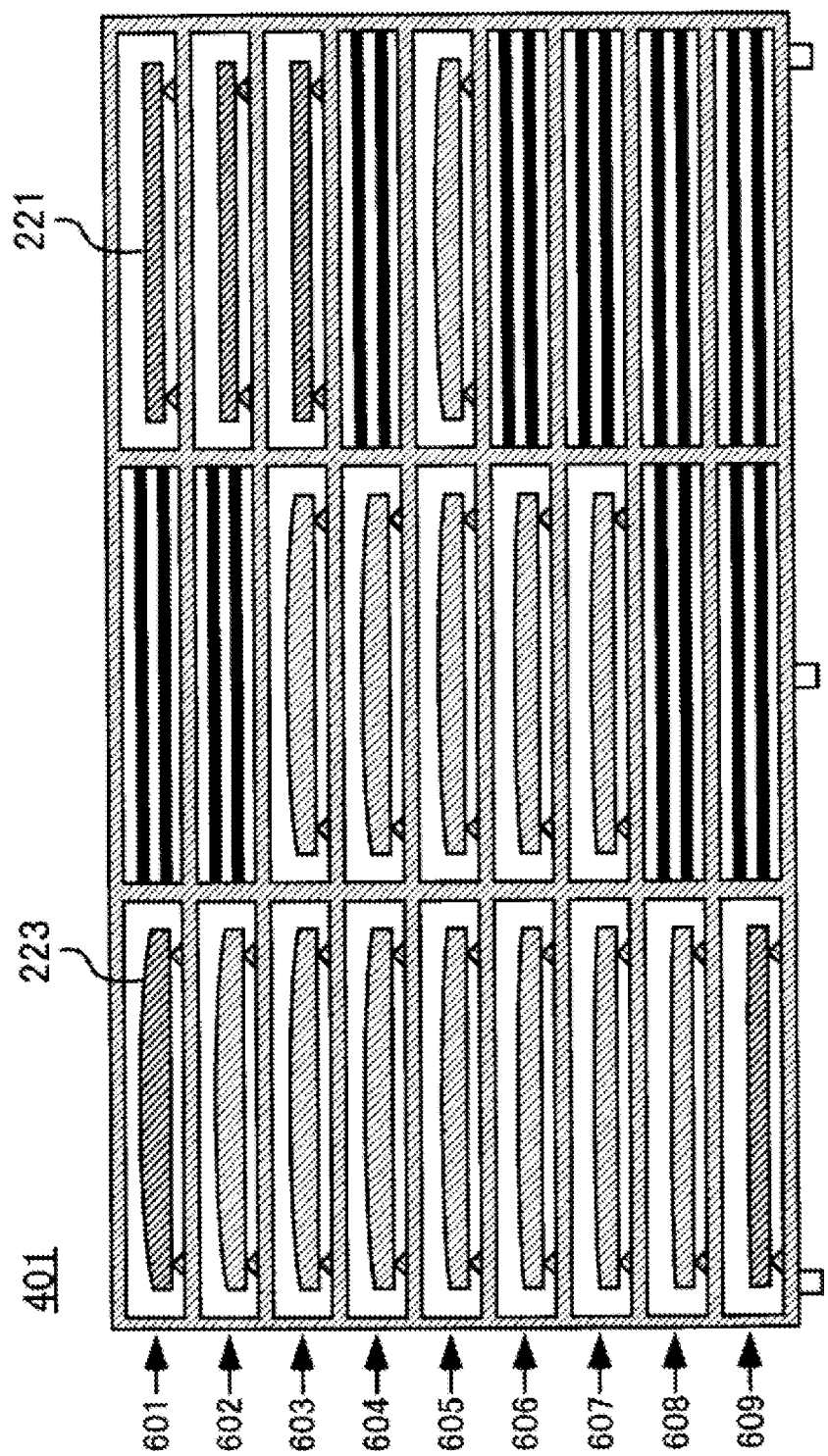
FIG. 18 is a schematic view of a holder stocker 401.

FIG. 18 is a schematic view of a holder stocker 401 corresponding to a different holder lineup. The holder stocker 401 includes a large number of housing units compared to the holder stocker 400. However, the types of the substrate holders 221, 223 housed in the holder stocker 401 are not different from those of the holder stocker 400 shown in FIG. 7.

The holder stocker 401 houses nine types of substrate holders 601, 602, 603, 604, 605, 606, 607, 608, 609 with stepwise changing degrees of convexness from the substrate holder 601 having a holding surface 225 with the largest degree of convexness in the entire holder lineup to the substrate holder 609 having a holding surface 225 with the smallest degree of convexness in the entire holder lineup, the number of each type of substrate holder all being one. In addition, the holder stocker 401 houses three substrate holders 605 having holding surfaces 225 with an approximately intermediate degree of convexness, and substrate holders 603, 604, 606, 607 having holding surfaces 225 with degrees of convexness slightly smaller or larger than that. The number of each among the substrate holders 603, 604, 606, 607 is two.

The number of these substrate holders 223 having holding surfaces 225 with the same degree of convexness is determined according to the frequency at which the substrate holders 223 having the degree of convexness are selected by the holder selecting unit 151, that is, the number of times of selection per unit period. Thereby, wear of each substrate holder 223 through use can be made uniform, and the effective use efficiency of substrate holders 223 can be improved. In this manner, substrate holders 223 housed in the holder stocker 401 may include a plurality of substrate holders having holding surfaces in the same state.

The lineups of substrate holders 223 housed in the holder stockers 400, 401 may be set to have numbers of substrate holders 223 for each kind of amounts of correction and each amount of correction such that they have distributions corresponding to the Gaussian distribution in terms of the state of warping in each lot of the two substrates 211, 213, for example. In addition, if substrates in lots with warp amounts of substrates 211, 213 that are different from each other are joined or if substrate products with designs different from conventional ones are joined, the different holder stockers 400, 401 housing different lineups may be prepared, and the holder stocker 400, 401 may entirely be retrofitted with entire lineups. Thereby, the work of setting up a lineup can be expedited, and the throughput of the stacking apparatus 100 can be improved.

Furthermore, the substrate holders 223 housed in the holder stockers 400, 401 can be partially or entirely replaced. In addition, a holder lineup consisting of a plurality of substrate holders 223 housed in the holder stocker 400, 401 may be replaced with a different holder stocker 400 housing a different holder lineup.

In addition, the holder stockers 400, 401 may be structured to be partially replaceable or to be able to be additionally provided. In this case, substrate holders 223 of high usage frequency are always provided to the stacking apparatus 100, and portions housing substrate holder 223 of low usage frequency or characteristic substrate holders 223 having holding surfaces with shapes other than spherical shapes may be configured such that they can be replaced at once. In addition, portions housing substrate holders 223 of high usage frequency may be configured such that they can be additionally provided or replaced.

Furthermore, at large-scale facilities where a plurality of the stacking apparatuses 100 are installed, each among the plurality of stacking apparatuses 100 may be equipped with a different lineup, and a lineup to be used for stacking may be changed by selecting a stacking apparatus 100 to be used itself, according to the states of shapes of or types of the substrates 211, 213 carried into it for stacking.

Figure 19:
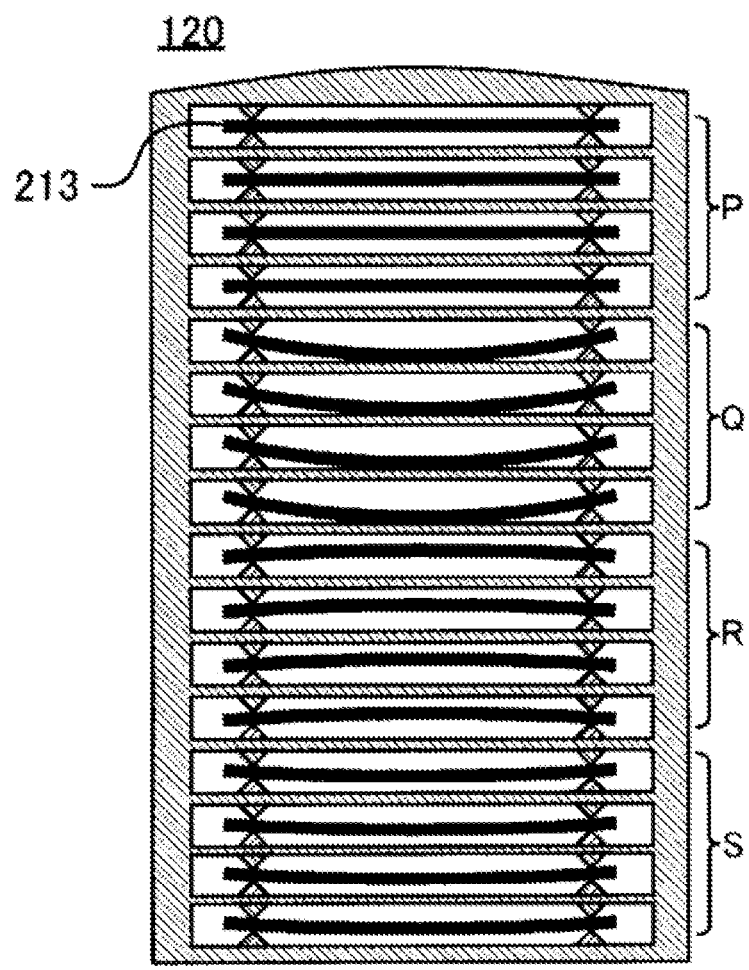
FIG. 19 is a schematic view of a substrate cassette 120.

FIG. 19 is a schematic view of the substrate cassette 120 housing substrates 210. As illustrated in the figure, the substrates 210 housed in the substrate cassette 120 form four groups P, Q, R, S, each group including substrates with the approximately same extent of warping.

Thereby, assuming that the substrates 210 housed in the substrate cassette 120 are stacked in the order starting from the ones located on the upper side in the figure, for example, substrate holders 223 which are in the same state in terms of at least one of curvatures, degrees of convexness, temperatures, surface roughness and holding forces can be used successively for each group P, Q, R, S. Therefore, in the stacking unit 300, the number of times of changing substrate holders 223 to be used can be reduced, and the throughput can be shortened.

For the sake of explanation, in FIG. 19, the substrates 210 are physically sorted, and substrates 210 that require comparable amounts of correction are grouped together. Substrates 210 with comparable amounts of correction mean substrates 210 that can be corrected by the same single substrate holder 223, and it means that the differences between the amounts of correction necessary for the substrates 210 and an amount of correction set to the substrate holder 223 are within a tolerated range. However, a plurality of substrates 210 may be housed in the substrate cassette 120 without being grouped. In this case, based on information to identify individual ones of the substrates 210 and information about amounts of correction necessary for the substrates, the carrying unit 140 is controlled by the control unit 150 of the stacking apparatus 100, and the order of carrying out the plurality of substrates 210 may be changed such that substrate holders 223 in the comparable state in terms of at least one of curvatures, degrees of convexness, temperatures, surface roughness and holding forces are used successively.

Furthermore, the control unit 150 may select, from a plurality of substrates 210 housed in the substrate cassette 120, a substrate 210 suited for the state of a holding surface of a substrate holder 220 currently being used in the stacking apparatus 100, and may prioritize the substrate 210 for a stacking process. In this case, if the holder selecting unit 151 selects one substrate holder 223 to be used in correction at Step S102, the substrate selecting unit 152 may select a substrate 213 that can be corrected by the substrate holder 223, and stack the substrate 213 in the next stacking process. Thereby, the throughput of the stacking apparatus 100 can be improved by consecutively using one substrate holder 220 and saving time for replacement of substrate holders 220.

Information to identify individual ones of the substrates 210 may be given to the individual substrates 210 as bar codes that are readable by the control unit 150 or the like. In addition, information to identify individual ones of the substrates 210 may be used as information to identify the housing positions of the individual substrates 210 in the substrate cassette 120.

Information used about amounts of correction of substrates may be the above-mentioned shape-related information of the substrates 210. Amounts of correction applied to the individual substrates 210 may be predicted or calculated from shape-related information about individual ones among the substrates 210.

Figure 20:
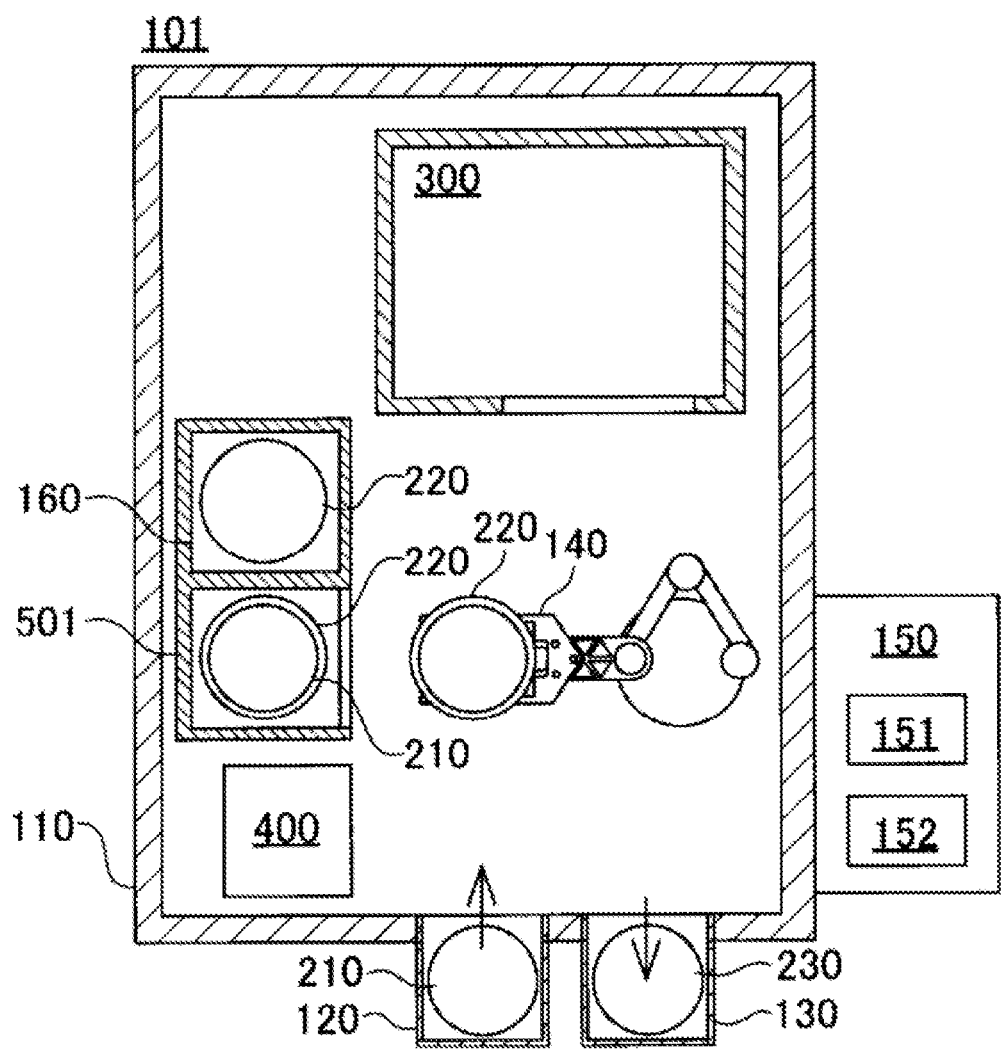
FIG. 20 is a schematic view of a stacking apparatus 101.

FIG. 20 is a schematic plan view of a different stacking apparatus 101. Except for portions explained next, the stacking apparatus 101 has the same structure as that of the stacking apparatus 100 shown in FIG. 1. Therefore, common elements between the stacking apparatus 100 and the stacking apparatus 101 are given the same reference numerals, and the same explanations are omitted.

The stacking apparatus 101 has a structure different from the stacking unit 300 in that it includes a waiting unit 160 provided adjacent to a prealigner 501. The waiting unit 160 can keep any of substrate holders 223 used for correction of a substrate 213 waiting, placing it very close to the prealigner 501.

Here, the substrate holder 223 placed in the waiting unit 160 may be a substrate holder 223 with high usage frequency. In addition, the substrate holder 223 placed in the waiting unit 160 may be a substrate holder 223 used at a next stacking process following an on-going stacking process. Thereby, a length of time required for changing a substrate holder 223 to use can be shortened, and the throughput of the stacking apparatus 101 can be shortened.

Figure 21:
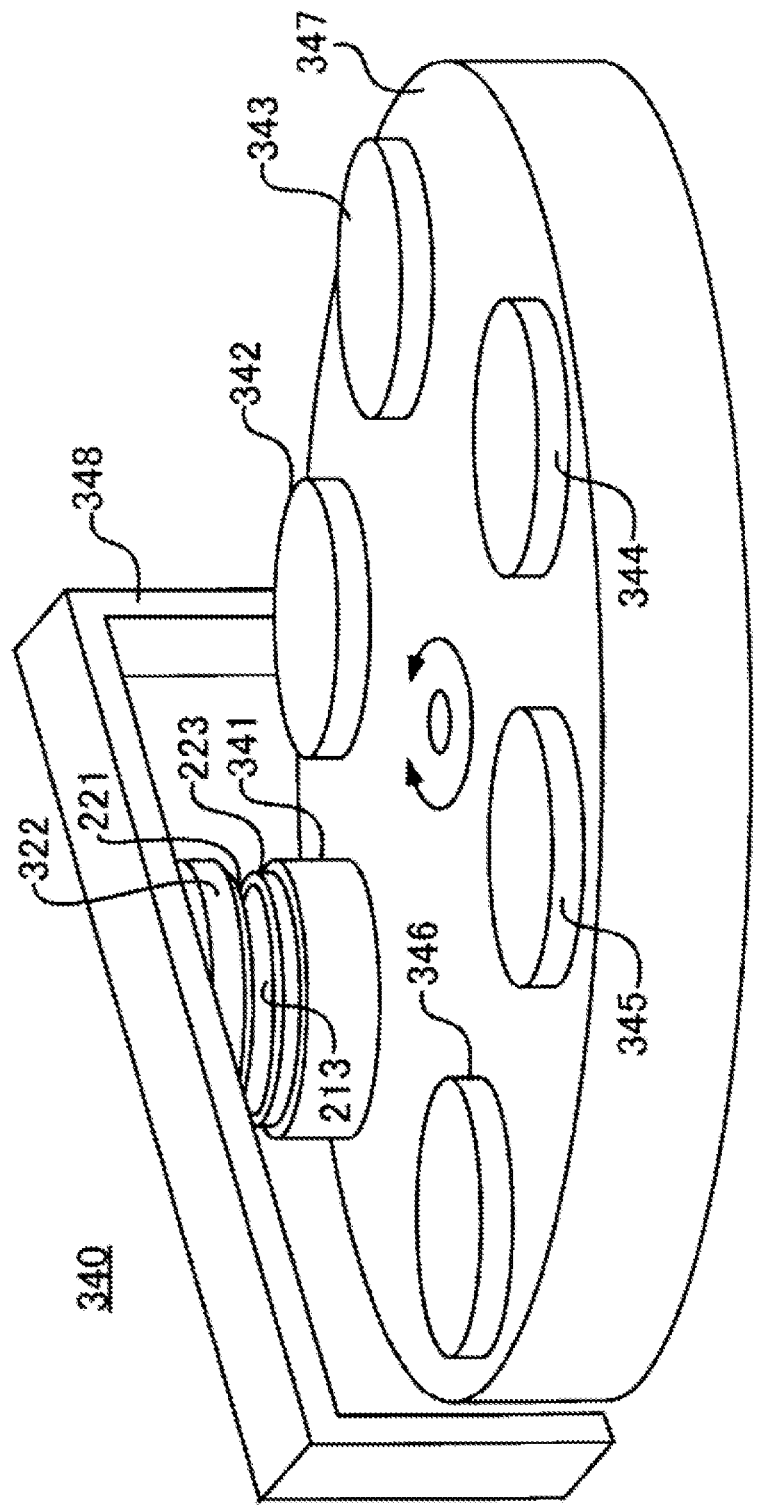
FIG. 21 is a schematic view of a stage apparatus 340.

FIG. 21 is a schematic perspective view of the stage apparatus 340. This stage apparatus 340 includes a single fixation stage 322, and a plurality of correction stages 341, 342, 343, 344, 345, 346. Each of the correction stages 341, 342, 343, 344, 345, 346 and fixation stage 322 is a different exemplary holding member, and has a holding mechanisms to suctionally attract and hold a substrate 210.

The plurality of correction stages 341, 342, 343, 344, 345, 346 are disposed along a common circle on a common turntable 347. The turntable 347 rotates about its vertical axis of rotation. In addition, each of the plurality of correction stages 341, 342, 343, 344, 345, 346 has the function of rising and lowering in a direction parallel with the axis of rotation of the turntable 347. The plurality of correction stages 341, 342, 343, 344, 345, 346 have holding surfaces in states that are different from each other.

The fixation stage 322 on which the substrate 211 is held is fixed to face downward in the figure from the frame 348 lying across the turntable 347. Thereby, rotating the turntable 347 can make any of the correction stages 341, 342, 343, 344, 345, 346 on which the substrate 213 is held face the fixation stage 322. The above-mentioned plurality of correction stages 341, 342, 343, 344, 345, 346 and a plurality of substrate holders 223 having different degrees of convexness or the like may be used in combination to thereby be able to more finely adjust an amount of correction.

Figure 22:
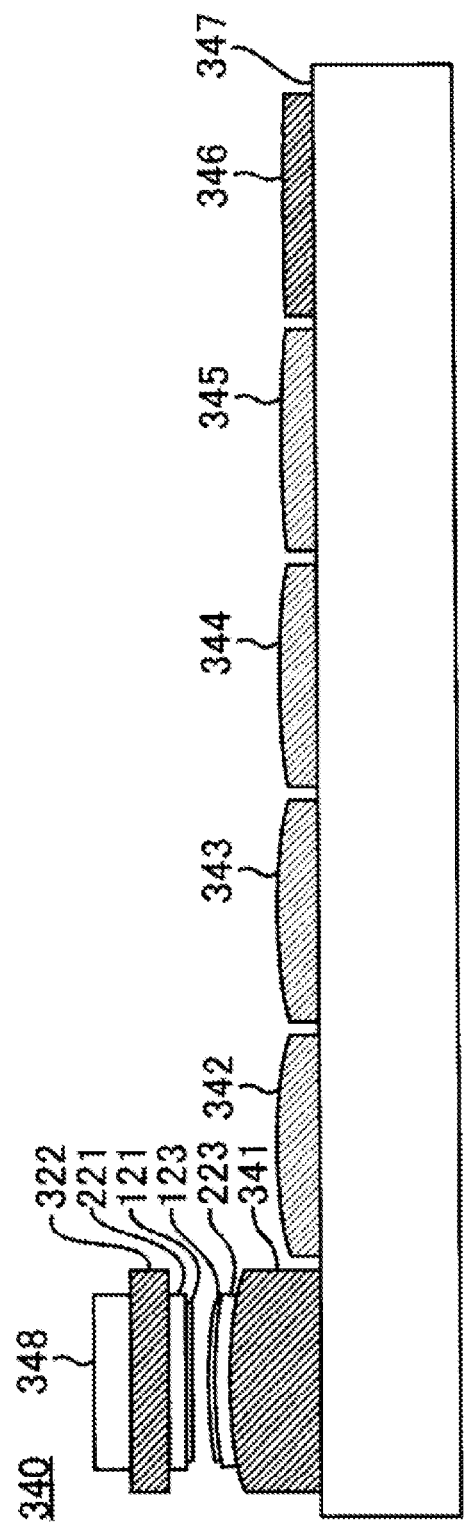
FIG. 22 is a schematic view of the stage apparatus 340.

FIG. 22 is a schematic view of the stage apparatus 340 in which the stage apparatus is unfolded for explaining the function of it. The fixation stage 322 holds a substrate along its flat holding surface. In contrast, in the example illustrated in the figure, the plurality of correction stages 341, 342, 343, 344, 345, 346 have holding surfaces with degrees of convexness that are different from each other, and hold substrates along their holding surfaces.

In such a stage apparatus 340, any of the plurality of correction stages 341, 342, 343, 344, 345, 346 is selected based on at least one of: measured amounts of deformation of the two substrates 211, 213; a magnification difference between the substrates 211, 213 estimated from the deformation amount measurement result; an amount of positional misalignment between the two substrates 211, 213; and amounts of correction of the two substrates 211, 213. The selected correction stage is caused to hold the substrate 210 directly to thereby be able to correct the substrate 210 by a different amount of correction without using the substrate holder 223. Therefore, using the stage apparatus 340, the stacking unit 300 to stack a substrate 210 while at the time correcting it can be formed without using a substrate holder 220.

While the embodiments of the present invention have been described, the technical scope of the invention is not limited to the above described embodiments. It is apparent to persons skilled in the art that various alterations and improvements can be added to the above-described embodiments. It is also apparent from the scope of the claims that the embodiments added with such alterations or improvements can be included in the technical scope of the invention.

The operations, procedures, steps, and stages of each process performed by an apparatus, system, program, and method shown in the claims, embodiments, or diagrams can be performed in any order as long as the order is not indicated by "prior to," "before," or the like and as long as the output from a previous process is not used in a later process. Even if the process flow is described using phrases such as "first" or "next" in the claims, embodiments, or diagrams, it does not necessarily mean that the process must be performed in this order.

What is claimed is:

1. A stacking apparatus that stacks a first substrate and a second substrate, the stacking apparatus comprising:
   a plurality of holding members that hold the first substrate, wherein
   the plurality of holding members correct positional misalignment of the first substrate relative to the second substrate by preset amounts of correction, and
   the plurality of holding members include holding members having the amounts of correction that are different from each other.

2. The stacking apparatus according to claim 1, comprising a holding member selecting unit that selects, from the plurality of holding members, a holding member to hold the first substrate based on information about the first substrate and the second substrate.

3. The stacking apparatus according to claim 2, further comprising a substrate selecting unit that selects a different substrate to be corrected by being held by the holding member selected by the holding member selecting unit, wherein the different substrate selected by the substrate selecting unit is held by the holding member selected by the holding member selecting unit, and the different substrate is stacked successively to stacking of the first substrate.

4. The stacking apparatus according to claim 2, further comprising a carrying unit that carries the holding member selected by the holding member selecting unit from a position where the holding member is housed to a position where the first substrate is held.

5. The stacking apparatus according to claim 4, wherein the information about the first substrate and the second substrate includes shape-related information of at least either the first substrate or the second substrate.

6. The stacking apparatus according to claim 5, wherein the shape-related information includes information about warping or bending of at least either the first substrate or the second substrate.

7. The stacking apparatus according to claim 5, wherein the shape-related information includes information about distortion, in a plane direction, of at least either the first substrate or the second substrate.

8. The stacking apparatus according to claim 5, wherein the shape-related information includes a difference in a shape of the first substrate from a predetermined shape.

9. The stacking apparatus according to claim 5, wherein the shape-related information includes a difference in a shape of the first substrate from a shape of the second substrate.

10. The stacking apparatus according to claim 4, wherein
the information about the first substrate and the second substrate includes information about positional misalignment between the first substrate and the second substrate, and
the holding member selecting unit selects the holding member based on the information about the positional misalignment.

11. The stacking apparatus according to claim 10, comprising a calculating unit that calculates an amount of correction that makes an amount of positional misalignment between the first substrate and the second substrate equal to or smaller than a threshold, wherein
the holding member selecting unit selects the holding member corresponding to the amount of correction calculated by the calculating unit.

12. The stacking apparatus according to claim 11, comprising a control unit that controls a holding force of the plurality of holding members, wherein
the calculating unit calculates a difference between an amount of correction set to the holding member selected by the holding member selecting unit and a calculated amount of correction, and
the control unit controls the holding force based on the calculated difference.

13. The stacking apparatus according to claim 1, wherein the plurality of holding members include holding members that each deform the first substrate by a preset amount of deformation and have amounts of deformation that are different from each other among the holding members.

14. The stacking apparatus according to claim 1, wherein the plurality of holding members include holding members that each have a holding surface to hold the first substrate, and shapes of the holding surfaces are different from each other among the holding members.

15. The stacking apparatus according to claim 14, wherein the plurality of holding members include holding members having degrees of convexness and curvatures of the holding surfaces, at least either the degrees of convexness or curvatures being different from each other among the holding members.

16. The stacking apparatus according to claim 1, wherein the plurality of holding members include holding members that each have a holding surface to hold the first substrate, and surface roughness of the holding surfaces to the first substrate is different from each other among the holding members.

17. The stacking apparatus according to claim 1, wherein the plurality of holding members include holding members that each have a holding surface to hold the first substrate, and temperatures of the holding surfaces are different from each other among the holding members.

18. The stacking apparatus according to claim 1, wherein the plurality of holding members include holding members having holding surfaces to hold the first substrate, and forces to hold the first substrate on the holding surfaces are different from each other among the plurality of holding members.

19. The stacking apparatus according to claim 1, wherein the plurality of holding members include substrate holders that are carried together with the first substrate being held.

20. The stacking apparatus according to claim 1, wherein any of the plurality of holding members includes a stage to hold the first substrate having been carried in.

21. The stacking apparatus according to claim 1, wherein the plurality of holding members further include holding members to correct the positional misalignment by the same amount of correction.

22. A stacking apparatus that stacks a first substrate and a second substrate, the stacking apparatus comprising:
a plurality of holding members that holds the first substrate, wherein
the plurality of holding members each have a different shape.

23. A stacking apparatus that stacks a first substrate and a second substrate, the stacking apparatus comprising:
a plurality of holding members that each have a holding surface to hold the first substrate, wherein
a holding surface of each of the plurality of holding members has a different state.

24. The stacking apparatus according to claim 23, wherein the state is at least one of a shape of the holding surface, a level of temperature, a degree of surface roughness and a strength of holding force.

25. A stacking method of stacking a first substrate and a second substrate, the stacking method comprising:
preparing a plurality of holding members that holds the first substrate and corrects positional misalignment of the first substrate relative to the second substrate by preset amounts of correction, the plurality of holding members including holding members to correct the first substrate by amounts of correction that are different from each other, and
causing any of the plurality of holding members to hold the first substrate based on information about the first substrate and the second substrate.

26. The stacking method according to claim 25, further comprising:
selecting a plurality of substrates to be corrected by one holding member of the plurality of holding members by an amount of correction set to the one holding member; and stacking the selected plurality of substrates successively using the one holding member repeatedly.

* * * * *